United States Patent
Ohsawa et al.

(10) Patent No.: US 9,741,967 B2
(45) Date of Patent: *Aug. 22, 2017

(54) LIGHT-EMITTING PANEL HAVING PLURALITY OF ORGANIC LIGHT-EMITTING ELEMENTS

(71) Applicant: Semiconductor Energy Laboratory Co., Ltd., Kanagawa-ken (JP)

(72) Inventors: Nobuharu Ohsawa, Tochigi (JP); Toshiki Sasaki, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 439 days.

This patent is subject to a terminal disclaimer.

(21) Appl. No.: 14/339,795

(22) Filed: Jul. 24, 2014

(65) Prior Publication Data

US 2014/0332831 A1 Nov. 13, 2014

Related U.S. Application Data

(63) Continuation of application No. 13/427,047, filed on Mar. 22, 2012, now Pat. No. 8,789,968.

(30) Foreign Application Priority Data

Mar. 25, 2011 (JP) .................. 2011-068680

(51) Int. Cl.
*H01L 33/60* (2010.01)
*F21K 99/00* (2016.01)
(Continued)

(52) U.S. Cl.
CPC ...... *H01L 51/5271* (2013.01); *H01L 27/3206* (2013.01); *H01L 27/3209* (2013.01); *H01L 51/5265* (2013.01); *H01L 27/3213* (2013.01)

(58) Field of Classification Search
CPC ...... H01J 2329/30; H01L 33/44; H01L 33/46; H01L 33/58; H01L 33/60; F21K 99/00;
(Continued)

(56) References Cited

U.S. PATENT DOCUMENTS 6,847,163 B1 1/2005 Tsutsui et al.
7,030,553 B2 4/2006 Winters et al.
(Continued)

FOREIGN PATENT DOCUMENTS

EP 1 744 600 A1 1/2007
EP 2 372 403 A1 10/2011
(Continued)

OTHER PUBLICATIONS

Kashiwabara, M. et al., "29.5L: Late-News Paper: Advanced AM-OLED Display Based on White Emitter with Microcavity Structure." SID Digest '04: SID International Symposium Digest of Technical Papers, 2004, vol. 35, pp. 1017-1019.
(Continued)

*Primary Examiner* — Ismael Negron
(74) *Attorney, Agent, or Firm* — Husch Blackwell LLP

(57) ABSTRACT

A light-emitting panel includes at least a first and a second light-emitting elements, each light-emitting element having, between a reflective film and a semi-transmissive/semi-reflective film, a layer including an optical adjustment layer and a light-emitting organic compound. One of the light-emitting elements further includes a layer transmitting red light provided over the corresponding semi-transmissive/semi-reflective film. The layer having the organic compound emits light having a wavelength between 600 nm and 800 nm, and light having a wavelength between 400 nm and 600 nm. The distance between the reflective film and the semi-transmissive/semi-reflective film in one of and the other one of the light-emitting elements are N/2 (where N is a natural
(Continued)

number) of a length between 600 nm and 800 nm, and N/2 of a length between 400 nm and 600 nm, respectively. The light-emitting panel might further include a third and a fourth light-emitting elements

18 Claims, 14 Drawing Sheets

(51) Int. Cl.
 *H01L 51/52* (2006.01)
 *H01L 27/32* (2006.01)
(58) Field of Classification Search
 CPC .................. F21K 9/00; F21Y 2105/001; F21Y 2105/005; F21Y 2113/005
 See application file for complete search history.

(56) References Cited

U.S. PATENT DOCUMENTS

| | | | |
|---|---|---|---|
| 7,271,537 B2 | 9/2007 | Matsuda et al. | |
| 7,317,282 B2 | 1/2008 | Tsutsui et al. | |
| 7,399,991 B2 | 7/2008 | Seo et al. | |
| 7,436,113 B2 | 10/2008 | Spindler | |
| 7,462,883 B2 | 12/2008 | Kumaki et al. | |
| 7,471,041 B2 | 12/2008 | Spindler | |
| 7,554,265 B2 | 6/2009 | Godo et al. | |
| 7,564,052 B2 | 7/2009 | Kumaki | |
| 7,601,988 B2 | 10/2009 | Seo et al. | |
| 7,602,119 B2 | 10/2009 | Miller et al. | |
| 7,663,149 B2 | 2/2010 | Seo et al. | |
| 7,737,626 B2 | 6/2010 | Kumaki et al. | |
| 7,741,770 B2 | 6/2010 | Cok et al. | |
| 7,753,751 B2 | 7/2010 | Yamazaki | |
| 7,851,989 B2 | 12/2010 | Noda | |
| 7,855,508 B2 | 12/2010 | Cok et al. | |
| 7,875,893 B2 | 1/2011 | Seo et al. | |
| 7,893,427 B2 | 2/2011 | Kumaki et al. | |
| 7,948,172 B2 | 5/2011 | Cok et al. | |
| 7,964,891 B2 | 6/2011 | Kumaki et al. | |
| 7,973,319 B2 | 7/2011 | Kashiwabara et al. | |
| 8,008,652 B2 | 8/2011 | Kumaki et al. | |
| 8,080,934 B2 | 12/2011 | Kido et al. | |
| 8,207,668 B2 | 6/2012 | Cok et al. | |
| 8,723,768 B2 | 5/2014 | Egi et al. | |
| 8,789,968 B2 * | 7/2014 | Ohsawa | H01L 51/5265 257/88 |
| 2005/0040756 A1 | 2/2005 | Winters et al. | |
| 2006/0163597 A1 | 7/2006 | Noda et al. | |
| 2006/0267483 A1 | 11/2006 | Tsutsui et al. | |
| 2006/0284204 A1 | 12/2006 | Yamazaki et al. | |
| 2007/0001570 A1 | 1/2007 | Nomura et al. | |
| 2007/0176161 A1 | 8/2007 | Seo et al. | |
| 2007/0216289 A1 | 9/2007 | Kuma et al. | |
| 2008/0241586 A1 | 10/2008 | Kumaki et al. | |
| 2009/0275161 A1 | 11/2009 | Kumaki et al. | |
| 2010/0053043 A1 | 3/2010 | Sakamoto | |
| 2010/0176720 A1 | 7/2010 | Yamazaki | |
| 2010/0231484 A1 | 9/2010 | Cok et al. | |
| 2011/0101345 A1 | 5/2011 | Kumaki et al. | |
| 2011/0101380 A1 | 5/2011 | Kumaki et al. | |
| 2011/0108864 A1 | 5/2011 | Seo et al. | |
| 2011/0140101 A1 | 6/2011 | Noda | |
| 2011/0241007 A1 | 10/2011 | Kumaki et al. | |
| 2011/0278562 A1 | 11/2011 | Kumaki et al. | |
| 2011/0291088 A1 | 12/2011 | Seo et al. | |
| 2011/0309351 A1 | 12/2011 | Kumaki et al. | |
| 2012/0026591 A1 | 2/2012 | Hayashibe et al. | |

FOREIGN PATENT DOCUMENTS

| | | |
|---|---|---|
| JP | 2002-324673 A | 11/2002 |
| JP | 2006-126817 A | 5/2006 |
| JP | 2006-324016 A | 11/2006 |
| JP | 2007-503093 | 2/2007 |
| JP | 2008-539555 | 11/2008 |
| JP | 2009-064703 A | 3/2009 |
| JP | 2009-129586 A | 6/2009 |
| JP | 2010-080423 A | 4/2010 |
| JP | 2010-539653 | 12/2010 |
| JP | 2010-541160 | 12/2010 |
| JP | 2010-541180 | 12/2010 |
| TW | 201040577 | 11/2010 |
| WO | WO 2005/020344 A1 | 3/2005 |
| WO | WO 2005/109964 A1 | 11/2005 |
| WO | WO 2006/115960 A1 | 11/2006 |
| WO | WO 2006/116346 A2 | 11/2006 |
| WO | WO 2006/116347 A2 | 11/2006 |
| WO | WO 2007/139210 A1 | 12/2007 |
| WO | WO 2009/038704 A1 | 3/2009 |
| WO | WO 2009/045273 A2 | 4/2009 |
| WO | WO 2009/048520 A1 | 4/2009 |

OTHER PUBLICATIONS

Matsumoto, T. et al., "27.5L: Late-News Paper: Multiphoton Organic EL Device Having Charge Generation Layer," SID Digest '03: SID International Symposium Digest of Technical Papers, 2003, vol. 34, pp. 979-981.

Taiwanese Office Action re Application No. TW 101109663, dated Feb. 18, 2016.

* cited by examiner

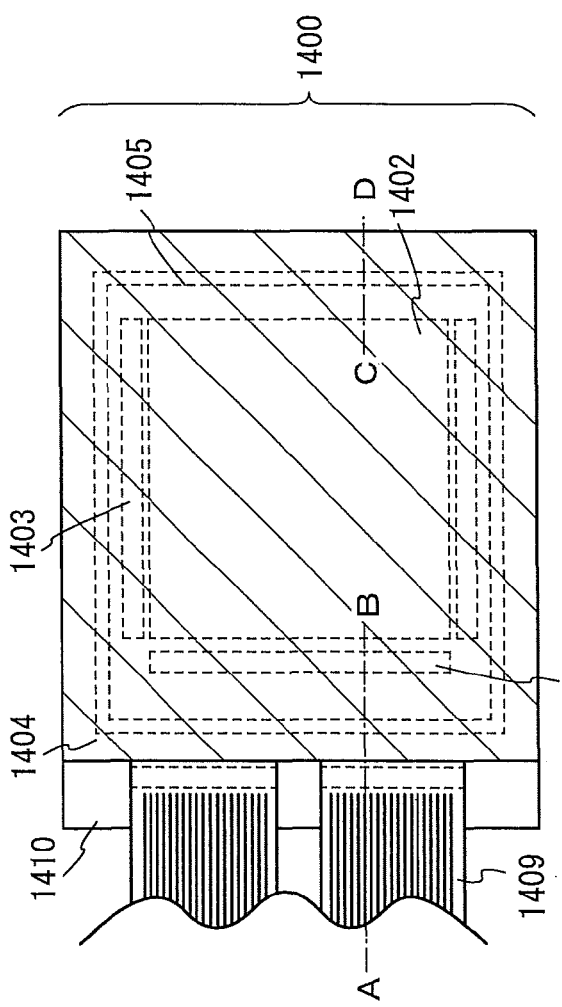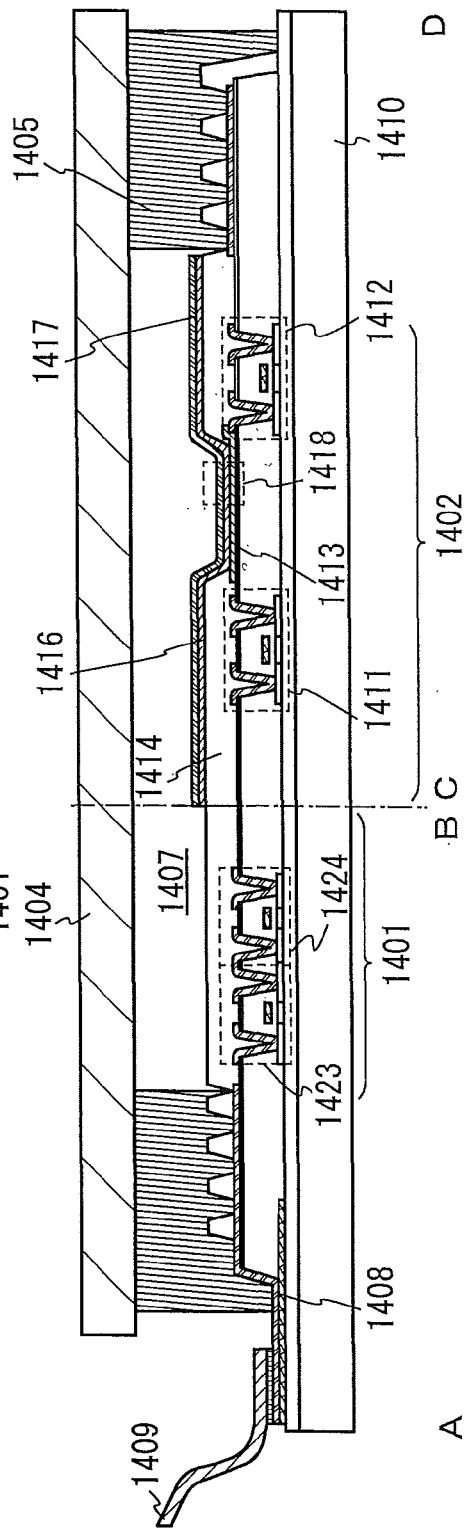
FIG. 7A
FIG. 7B

LIGHT-EMITTING PANEL HAVING PLURALITY OF ORGANIC LIGHT-EMITTING ELEMENTS

This application is a continuation of copending U.S. application Ser. No. 13/427,047, filed on Mar. 22, 2012 which is incorporated herein by reference.

BACKGROUND OF THE INVENTION

1. Field of the Invention

The present invention relates to a light-emitting panel, a light-emitting device including the light-emitting panel, and a method for manufacturing the light-emitting panel.

2. Description of the Related Art

Mobile phones, personal computers, smartphones, e-book readers, and the like have come into widespread use, and the length of time display devices are used in our life has thus increased.

Since these electronic devices are now in popular use, they are also used for simple work which has conventionally been done with stationery. Specifically, schedule management, address list management, making notes, and the like which have conventionally been done with a notebook are now done with multifunctional electronic devices typified by smartphones.

A light-emitting element in which a layer containing a light-emitting organic compound (also referred to as EL layer) which has a film shape is provided between a pair of electrodes is known. Such a light-emitting element is referred to as, for example, an organic EL element, and light emission can be obtained from the light-emitting organic compound when voltage is applied between the pair of electrodes. A lighting device, a display device, and the like are known as a light-emitting device including an organic EL element. An example of a display device including an organic EL element is disclosed in Patent Document 1.

REFERENCE

[Patent Document 1] Japanese Published Patent Application No. 2002-324673

SUMMARY OF THE INVENTION

Portable information terminals are expected to be able to be used for a long time without frequent charging, to be lightweight, and to have excellent portability. Display devices included in the portable information terminals are required to cause less eyestrain even in the case of long-time use and to be easily manufactured in addition to low power consumption and lightness. Needless to say, the display devices are required to display high-definition images and reproduce clear moving images; however, priority is put on a reduction in power consumption rather than an increase in the number of colors that can be displayed in some cases, for example in the case where the display devices are used instead of stationery. Note that the above technical objects are required not only for light-emitting devices including display devices used in portable electronic devices but also for stationary light-emitting devices in view of resource saving, energy saving, and highly added values.

Embodiments of the present invention are made in view of the foregoing technical background. Specifically, an object of one embodiment of the present invention is to provide a light-emitting panel which is capable of multicolor light emission and whose power consumption is reduced. An object of one embodiment of the present invention is to provide a light-emitting device which is capable of multicolor light emission and whose power consumption is reduced. An object of one embodiment of the present invention is to provide a highly productive method for manufacturing a light-emitting panel which is capable of multicolor display and whose power consumption is reduced.

In order to achieve the above objects, the present invention focuses on a structure which includes a plurality of light-emitting elements, in each of which an optical adjustment layer and a layer containing a light-emitting organic compound which emits multicomponent light and is interposed between a pair of electrodes are provided between a pair of a reflective film and a semi-transmissive and semi-reflective film. The inventors have reached a structure including a first light-emitting element, a second light-emitting element, and a third light-emitting element as described below. In the first light-emitting element, a layer containing a light-emitting organic compound, which is interposed between a pair of electrodes and emits light including light with a wavelength greater than or equal to 400 nm and less than 600 nm and light with a wavelength greater than or equal to 600 nm and less than 800 nm, is provided between a pair of a reflective film and a semi-transmissive and semi-reflective film, the optical path length between which is N/2 (N is a natural number) of the length greater than or equal to 600 nm and less than 800 nm. The first light-emitting element emits light with high brightness and of a pale color. In the second light-emitting element, a layer containing a light-emitting organic compound is provided between a pair of a reflective film and the semi-transmissive and semi-reflective film, the optical path length between which is N/2 (N is a natural number) of the length greater than or equal to 600 nm and less than 800 nm, and a layer transmitting red light is further provided so as to overlap with the semi-transmissive and semi-reflective film. In the third light-emitting element, a layer containing a light-emitting organic compound is provided between a pair of a reflective film and the semi-transmissive and semi-reflective film, the optical path length between which is N/2 (N is a natural number) of the length greater than or equal to 400 nm and less than 600 nm. The third light-emitting element emits light with high saturation and of a color different from red. With the structure, the above objects are achieved.

In other words, one embodiment of the present invention is a light-emitting panel including a first light-emitting element, a second light-emitting element, and a third light-emitting element, in each of which an optical adjustment layer and a layer containing a light-emitting organic compound interposed between a pair of electrodes are provided between a pair of a reflective film and a semi-transmissive and semi-reflective film. The layer containing a light-emitting organic compound emits light including light with a wavelength greater than or equal to 600 nm and less than 800 nm and light with a wavelength greater than or equal to 400 nm and less than 600 nm. The first light-emitting element and the second light-emitting element have an equal optical path length between the pair of the reflective film and the semi-transmissive and semi-reflective film of N/2 (N is a natural number) of the length greater than or equal to 600 nm and less than 800 nm. In the second light-emitting element, a layer transmitting red light is provided so as to overlap with the semi-transmissive and semi-reflective film. In the third light-emitting element, the optical path length between the pair of the reflective film and the semi-transmissive and semi-reflective film is N/2 (N is a natural number) of the length greater than or equal to 400 nm and less than 600 nm.

The light-emitting panel of one embodiment of the present invention includes the first light-emitting element which emits mixed light including light with a wavelength greater than or equal to 600 nm and less than 800 nm and light with a wavelength greater than or equal to 400 nm and less than 600 nm, which are intensified between the pair of the reflective film and the semi-transmissive and semi-reflective film; the second light-emitting element which emits red light obtained by extracting the mixed light through the layer transmitting red light; and the third light-emitting element which emits light with a wavelength greater than or equal to 400 nm and less than 600 nm, which is intensified between the pair of the reflective film and the semi-transmissive and semi-reflective film.

According to one embodiment of the present invention, a light-emitting panel can be manufactured in which a first light-emitting element emits light having high brightness and a pale color and causing less eyestrain even in the case of long-time use, a second light-emitting element emits light of a bright red color, and a third light-emitting element emits light of a bright color different from the colors of the light emitted from the first light-emitting element and the second light-emitting element. Further, a layer transmitting light of a specific color (e.g., a color filter) is not provided in all the light-emitting elements except the second light-emitting element; thus, light emitted from the layer containing a light-emitting organic compound can be efficiently used. As a result, a light-emitting panel which is capable of multicolor light emission and whose power consumption is reduced can be provided.

One embodiment of the present invention is a light-emitting panel including a first light-emitting element, a second light-emitting element, a third light-emitting element, and a fourth light-emitting element in each of which an optical adjustment layer and a layer containing a light-emitting organic compound interposed between a pair of electrodes are provided between a pair of a reflective film and a semi-transmissive and semi-reflective film. The layer containing a light-emitting organic compound emits light including light with a wavelength greater than or equal to 600 nm and less than 800 nm, light with a wavelength greater than or equal to 500 nm and less than 600 nm, and light with a wavelength greater than or equal to 400 nm and less than 500 nm. The first light-emitting element and the second light-emitting element have an equal optical path length between the pair of the reflective film and the semi-transmissive and semi-reflective film of N/2 (N is a natural number) of the length greater than or equal to 600 nm and less than 800 nm. In the second light-emitting element, a layer transmitting red light is provided so as to overlap with the semi-transmissive and semi-reflective film. The optical path length between the pair of the reflective film and the semi-transmissive and semi-reflective film in the third light-emitting element is N/2 (N is a natural number) of the length greater than or equal to 500 nm and less than 600 nm. The optical path length between the pair of the reflective film and the semi-transmissive and semi-reflective film in the fourth light-emitting element is N/2 (N is a natural number) of the length greater than or equal to 400 nm and less than 500 nm.

The light-emitting panel of one embodiment of the present invention includes the first light-emitting element which emits mixed light including light with a wavelength greater than or equal to 600 nm and less than 800 nm and light with a wavelength greater than or equal to 400 nm and less than 600 nm, which are intensified between the pair of the reflective film and the semi-transmissive and semi-reflective film; the second light-emitting element which emits red light obtained by extracting the mixed light through the layer transmitting red light; the third light-emitting element which emits light with a wavelength greater than or equal to 500 nm and less than 600 nm, which is intensified between the pair of the reflective film and the semi-transmissive and semi-reflective film; and the fourth light-emitting element which emits light with a wavelength greater than or equal to 400 nm and less than 500 nm, which is intensified between the pair of the reflective film and the semi-transmissive and semi-reflective film.

According to one embodiment of the present invention, a light-emitting panel can be manufactured in which a first light-emitting element emits light having high brightness and a pale color and causing less eyestrain even in the case of long time, a second light-emitting element emits light of a bright red color, a third light-emitting element emits green light, and a fourth light-emitting element emits blue light. Further, a layer transmitting light of a specific color (e.g., a color filter) is not provided in all the light-emitting elements except the second light-emitting element; thus, light emitted from the layer containing a light-emitting organic compound can be efficiently used. As a result, a light-emitting panel which is capable of bright, full-color light emission and whose power consumption is reduced can be provided.

One embodiment of the present invention is the light-emitting panel in which with respect to light with a wavelength greater than or equal to 400 nm and less than 800 nm, the reflective film has a reflectance greater than or equal to 1%, preferably greater than or equal to 30% and less than 100%, the semi-transmissive and semi-reflective film has a reflectance greater than or equal to 1%, preferably greater than or equal to 5% and less than 100%, and a transmittance greater than or equal to 1%, preferably greater than or equal to 30% and less than 100%.

According to one embodiment of the present invention, a pair of a reflective film and a semi-transmissive and semi-reflective film forms a micro resonator (also referred to as microcavity). In particular, a light-emitting element in which the optical path length which depends on the distance between the reflective film and the semi-transmissive and semi-reflective film is N/2 (N is a natural number) of the length greater than or equal to 400 nm and less than 600 nm emits light which has a narrow full width at half maximum, a shorter wavelength than red light, and a bright color. As a result, a light-emitting panel which is capable of multicolor light emission and whose power consumption is reduced can be provided.

According to one embodiment of the present invention, in the light-emitting panel, the optical adjustment layer can have electrical conductivity and can also serve as one of the pair of electrodes.

When the optical adjustment layer also serves as the one of the electrodes, the structure is simplified, which results in easy manufacture.

According to one embodiment of the present invention, in the light-emitting panel, the semi-transmissive and semi-reflective film can have electrical conductivity and can also serve as the other of the pair of electrodes.

When the semi-transmissive and semi-reflective film also serves as the other of the electrodes, the structure is simplified, which results in easy manufacture.

According to one embodiment of the present invention, in the light-emitting panel, the reflective film can have electrical conductivity and can be electrically connected to the one of the pair of electrodes.

With the above structure, electric power can be supplied to the one of the pair of electrodes through the reflective film having electrical conductivity. As a result, an increase in drive voltage due to the electric resistance (e.g., sheet resistance) of the one of the electrodes can be suppressed. Thus, a light-emitting panel which is capable of multicolor light emission and whose power consumption is reduced can be provided. Moreover, the light-emitting panel has a simplified structure, and thus can be manufactured easily.

According to one embodiment of the present invention, in the light-emitting panel, the first light-emitting element, the second light-emitting element, and the third light-emitting element can include layers containing light-emitting organic compounds, which are formed in the same step.

According to one embodiment of the present invention, layers containing light-emitting organic compounds included in a first light-emitting element, a second light-emitting element, and a third light-emitting element can be formed in the same step. As a result, a light-emitting panel which is capable of multicolor light emission and whose power consumption is reduced can be provided. Moreover, the light-emitting panel has a simplified structure, and thus can be manufactured easily.

One embodiment of the present invention is a light-emitting device including any of the light-emitting panels.

According to one embodiment of the present invention, a light-emitting device including the light-emitting panel as a display portion can be manufactured. As a result, a light-emitting device which is capable of multicolor display and whose power consumption is reduced can be provided.

One embodiment of the present invention is a method for manufacturing a light-emitting panel, including the steps of: forming a conductive reflective film in a first light-emitting element, a second light-emitting element, a third light-emitting element, and a fourth light-emitting element; forming a conductive optical adjustment layer in the first light-emitting element and the second light-emitting element; forming, in the third light-emitting element, an optical adjustment layer thinner than the optical adjustment layer provided in the first light-emitting element and the second light-emitting element; forming, in the fourth light-emitting element, an optical adjustment layer thinner than the optical adjustment layer provided in the third light-emitting element; forming a layer containing a light-emitting organic compound, which emits light including light with a wavelength greater than or equal to 600 nm and less than 800 nm, light with a wavelength greater than or equal to 500 nm and less than 600 nm, and light with a wavelength greater than or equal to 400 nm and less than 500 nm so as to be in contact with the optical adjustment layer of the first light-emitting layer, the optical adjustment layer of the second light-emitting element, the optical adjustment layer of the third light-emitting element, and the reflective film of the fourth light-emitting element at once; forming a conductive semi-transmissive and semi-reflective film overlapping with the optical adjustment layer of the first light-emitting layer, the optical adjustment layer of the second light-emitting element, the optical adjustment layer of the third light-emitting element, and the reflective film of the fourth light-emitting layer so as to be in contact with the layer containing a light-emitting organic compound; and forming a layer transmitting red light so as to overlap with the semi-transmissive and semi-reflective film of the second light-emitting element.

According to the method for manufacturing a light-emitting panel of one embodiment of the present invention, a light-emitting panel including four kinds of light-emitting elements which emit light of different colors (specifically, light-emitting elements which emit light of red, green, blue, and a pale color with high brightness) can be manufactured by the steps of forming two kinds of optical adjustment layers with different thicknesses and a red color filter. As a result, a simple method for manufacturing a light-emitting panel capable of full-color light emission can be provided.

Note that "light with high brightness and of a pale color" in this specification means light with high luminance and low color purity. For example, in the case of the chromaticity diagram having red, green, and blue as the three primary colors, colors existing inside the triangle formed by connecting the chromaticity points of red, green, and blue can be regarded as colors having lower color purity than the three primary colors. In addition, white light can exist near the center of the triangle, which means that light with low color purity has a pale color.

Note that "optical path length" in this specification means the product of distance and refractive index. Therefore, the optical path length of a medium having a refractive index of more than 1 is longer than the actual distance. Note that the optical path length in a resonator of a micro resonator (also referred to as microcavity) can be obtained by measuring optical interference. Specifically, the optical path length in a resonator can be obtained as follows: an intensity ratio of reflected light to incident light is measured with a spectrophotometer and the measured intensity ratio is plotted with respect to a wavelength.

In this specification, an EL layer refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as host material, and the substance A dispersed in the matrix is referred to as guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

According to one embodiment of the present invention, a light-emitting panel which is capable of multicolor light emission and whose power consumption is reduced can be provided. In addition, a light-emitting device which is capable of multicolor light emission and whose power consumption is reduced can be provided. In addition, a highly productive method for manufacturing a light-emitting panel which is capable of multicolor light emission and whose power consumption is reduced can be provided.

BRIEF DESCRIPTION OF THE DRAWINGS

FIGS. 7A and 7B illustrate a light-emitting device to which a light-emitting panel according to an embodiment is applied.

DETAILED DESCRIPTION OF THE INVENTION

Figure 1A:
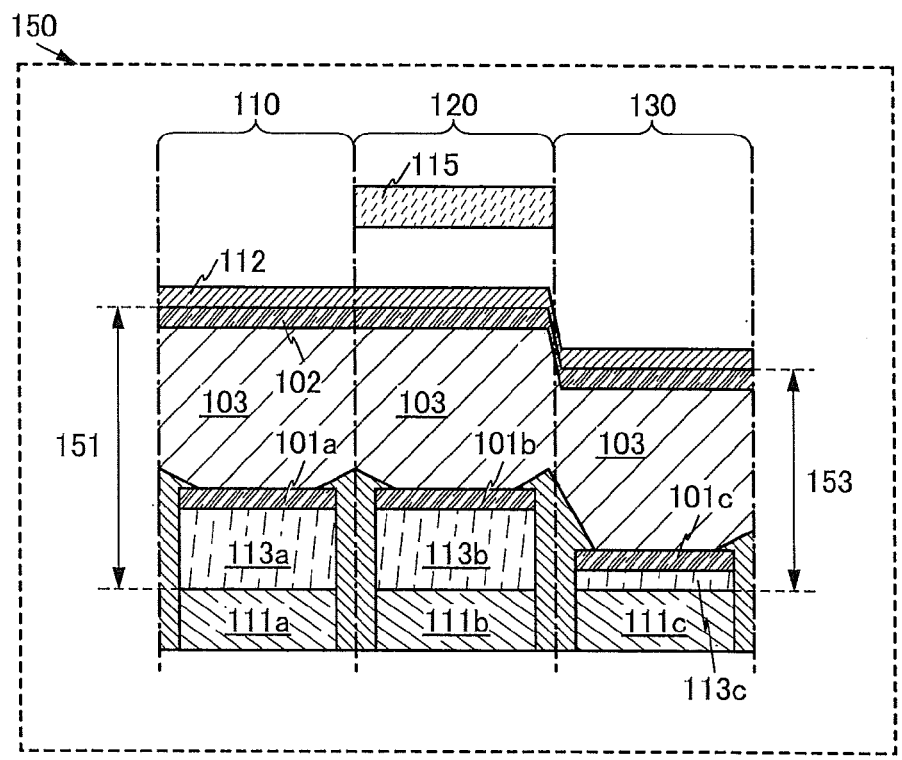
FIGS. 1A and 1B each illustrate a structure of a light-emitting panel according to an embodiment.

Embodiments and Example will be described in detail with reference to the accompanying drawings. Note that the present invention is not limited to the following description and that it is easily understood by those skilled in the art that various changes and modifications can be made without departing from the spirit and scope of the present invention. Therefore, the present invention should not be construed as being limited to the description in the following embodiments and example. Note that in the structures of the invention described below, the same portions or portions having similar functions are denoted by the same reference numerals in different drawings, and description of such portions is not repeated.

Embodiment 1

In this embodiment, a light-emitting panel including a first light-emitting element, a second light-emitting element, and a third light-emitting element will be described with reference to FIGS. 1A and 1B. In the first light-emitting element, a layer containing a light-emitting organic compound, which is interposed between a pair of electrodes and emits light including light with a wavelength greater than or equal to 400 nm and less than 600 nm and light with a wavelength greater than or equal to 600 nm and less than 800 nm, is provided between a pair of a reflective film and a semi-transmissive and semi-reflective film, the optical path length between which is N/2 (N is a natural number) of the length greater than or equal to 600 nm and less than 800 nm. The first light-emitting element emits light with high brightness and of a pale color. In the second light-emitting element, the layer containing a light-emitting organic compound is provided between a pair of a reflective film and the semi-transmissive and semi-reflective film, the optical path length between which is N/2 (N is a natural number) of the length greater than or equal to 600 nm and less than 800 nm, and a layer transmitting red light is further provided so as to overlap with the semi-transmissive and semi-reflective film. In the third light-emitting element, the layer containing a light-emitting organic compound is provided between a pair of a reflective film and the semi-transmissive and semi-reflective film, the optical path length between which is N/2 (N is a natural number) of the length greater than or equal to 400 nm and less than 600 nm. The third light-emitting element emits light with high saturation and of a color different from red.

The description will be made on, specifically, a light-emitting panel including a first light-emitting element, a second light-emitting element, and a third light-emitting element, in each of which an optical adjustment layer and a layer containing a light-emitting organic compound interposed between a pair of electrodes are provided between a pair of a reflective film and a semi-transmissive and semi-reflective film. The layer containing a light-emitting organic compound emits light including light with a wavelength greater than or equal to 600 nm and less than 800 nm and light with a wavelength greater than or equal to 400 nm and less than 600 nm. The first light-emitting element and the second light-emitting element have an equal optical path length between the pair of the reflective film and the semi-transmissive and semi-reflective film of N/2 (N is a natural number) of the length greater than or equal to 600 nm and less than 800 nm. In the second light-emitting element, a layer transmitting red light is provided so as to overlap with the semi-transmissive and semi-reflective film. The optical path length between the reflective film and the semi-transmissive and semi-reflective film in the third light-emitting element is N/2 (N is a natural number) of the length greater than or equal to 400 nm and less than 600 nm. Note that "the optical path length is N/2 (N is a natural number) of the length greater than or equal to 600 nm and less than 800 nm" specifically means that the optical path length is greater than or equal to 300 nm and less than 400 nm (i.e., N is 1), greater than or equal to 600 nm and less than 800 nm (i.e., N is 2), greater than or equal to 900 nm and less than 1200 nm (i.e., N is 3), and the like.

FIG. 1A illustrates a structure of a light-emitting panel of one embodiment of the present invention. The light-emitting panel illustrated in FIG. 1A includes a first light-emitting element 110, a second light-emitting element 120, and a third light-emitting element 130. The first light-emitting element 110 includes a reflective film 111a, a semi-transmissive and semi-reflective film 112, and between the reflective film 111a and the semi-transmissive and semi-reflective film 112, an optical adjustment layer 113a and a layer 103 containing a light-emitting organic compound interposed between a pair of electrodes (a first electrode 101a and a second electrode 102). The second light-emitting element 120 includes a reflective film 111b, the semi-transmissive and semi-reflective film 112, and between the reflective film 111b and the semi-transmissive and semi-reflective film 112, an optical adjustment layer 113b and the layer 103 containing a light-emitting organic compound interposed between a pair of electrodes (a first electrode 101b and the second electrode 102). The third light-emitting element 130 includes a reflective film 111c, the semi-transmissive and semi-reflective film 112, and between the reflective film 111c and the semi-transmissive and semi-reflective film 112, an optical adjustment layer 113c and the layer 103 containing a light-emitting organic compound interposed between a pair of electrodes (a first electrode 101c and the second electrode 102).

Further, in the second light-emitting element, a layer 115 transmitting red light is provided on the semi-transmissive and semi-reflective film 112 side so as to overlap with the reflective film 111b.

1. Structure of Pair of Reflective Film and Semi-Transmissive and Semi-Reflective Film The reflective films (111a, 111b, and 111c) reflect light with a wavelength greater than or equal to 400 nm and less than 800 nm. In particular, the reflective films preferably have a reflectance greater than or equal to 1%, preferably greater than or equal to 30% and less than 100%, in which case light emitted from the layer 103 containing a light-emitting organic compound can be efficiently reflected.

As examples of materials that can be used for the reflective films (111a, 111b, and 111c), the following can be given: aluminum, silver, gold, platinum, copper, an alloy containing aluminum (e.g., an aluminum-titanium alloy or an aluminum-neodymium alloy), an alloy containing silver (a silver-neodymium alloy), an alloy containing silver (a magnesium-silver alloy), and the like.

The semi-transmissive and semi-reflective film 112 partly reflects and partly transmits light with a wavelength greater than or equal to 400 nm and less than 800 nm. Thus, light emitted from the layer 103 containing a light-emitting organic compound can be extracted through the semi-transmissive and semi-reflective film. In particular, when the reflectance is greater than or equal to 1%, preferably greater than or equal to 5% and less than 100% and the transmittance is greater than or equal to 1%, preferably greater than or equal to 10% and less than 100%, a microresonator is formed between a pair of the semi-transmissive and semi-reflective film and the reflective film. The optical path length of the first light-emitting element 110 of the light-emitting panel 150 illustrated in FIG. 1A depends on the distance between the reflective film 111a and the semi-transmissive and semi-reflective film 112 (indicated by an arrow 151). The optical path length of the third light-emitting element 130 depends on the distance between the reflective film 111c and the semi-transmissive and semi-reflective film 112 (indicated by an arrow 153). In each of the first light-emitting element and the second light-emitting element of this embodiment, the optical path length of a microresonator formed between the pair of the reflective film and the semi-transmissive and semi-reflective film is adjusted to N/2 (N is a natural number) of the length greater than or equal to 600 nm and less than 800 nm; in the third light-emitting element, the optical path length of a microresonator formed between the pair of the reflective film and the semi-transmissive and semi-reflective film is adjusted to N/2 (N is a natural number) of the length greater than or equal to 400 nm and less than 600 nm.

Thus, the first light-emitting element emits mixed light including light with a wavelength greater than or equal to 600 nm and less than 800 nm and light with a wavelength greater than or equal to 400 nm and less than 600 nm which are intensified by the microresonator. In the mixed light, a component of red light is mixed with a component of light of another color (e.g., blue); thus, the color of the mixed light has low saturation and exists in a region close to white region in the chromaticity diagram. Therefore, the mixed light can be regarded as light of a pale color. The second light-emitting element extracts red light from the mixed light. The third light-emitting element in which the optical path length is adjusted to N/2 (N is a natural number) of the length greater than or equal to 400 nm and less than 600 nm emits light with a narrow full width at half maximum and of a bright color (e.g., blue or green), which is intensified by the microresonator.

As the semi-transmissive and semi-reflective film 112, a metal film having a thickness by which light with a wavelength greater than or equal to 400 nm and less than 800 nm is partly reflected and through which the light is partly transmitted can be used. For example, the semi-transmissive and semi-reflective film 112 may be formed to a thickness greater than or equal to 0.1 nm and less than 100 nm using a material similar to those of the reflective films (111a, 111b, and 111c).

2. Structure of Optical Adjustment Layer

The optical adjustment layer transmits light with a wavelength greater than or equal to 400 nm and less than 800 nm. In particular, the optical adjustment layer preferably has a transmittance greater than or equal to 1%, preferably greater than or equal to 30% and less than 100%, in which case energy loss of light emitted from the layer 103 containing a light-emitting organic compound is difficult to occur.

As examples of materials that can be used for the optical adjustment layers (113a, 113b, and 113c), the following can be given: indium tin oxide (ITO), silicon oxide, lithium fluoride, magnesium fluoride, titanium oxide, silicon oxynitride, zirconium oxide, titanium carbide, and the like.

The optical adjustment layer adjusts the optical path length between the reflective film and the semi-transmissive and semi-reflective film. In the light-emitting panel illustrated in FIG. 1A, the optical adjustment layer 113a included in the first light-emitting element 110, the optical adjustment layer 113b included in the second light-emitting element 120, and the optical adjustment layer 113c included in the third light-emitting element 130 each adjust the optical path length between the reflective film and the semi-transmissive and semi-reflective film.

Specifically, each of the optical adjustment layer 113a and the optical adjustment layer 113b together with the layer 103 containing a light-emitting organic compound interposed between the pair of electrodes adjusts the optical path length to N/2 (N is a natural number) of the length greater than or equal to 600 nm and less than 800 inn. In addition, the optical adjustment layer 113c included in the third light-emitting element 130 together with the layer 103 containing a light-emitting organic compound adjusts the optical path length to N/2 (N is a natural number) of the length greater than or equal to 400 nm and less than 600 nm.

Note that although the structure in which the optical adjustment layer is provided between the reflective film (111a, 111b, or 111c) and one of the pair of electrodes between which the layer 103 containing a light-emitting organic compound is interposed and in contact with the electrode is illustrated in FIG. 1A, one embodiment of the present invention is not limited to the structure. For example, a structure may be employed in which the optical adjustment layer is provided between the semi-transmissive and semi-reflective electrode and the other of the pair of electrodes and in contact with the other of the pair of electrodes. A structure may also be employed in which two optical adjustment layers are provided, one of which is provided between the one of the electrodes and the reflective film (111a, 111b, or 111c) and the other of which is provided between the other of the pair of electrodes and the semi-transmissive and semi-reflective film 112.

The position where the optical adjustment layer is provided may be determined as appropriate depending on the easiness of manufacture of a light-emitting panel of one embodiment of the present invention.

For example, in the case where diffusion of impurities such as moisture into the layer 103 containing a light-emitting organic compound is expected to be prevented, photolithography cannot be performed after the formation of the layer 103 containing a light-emitting organic compound. For that reason, in the case where minute optical adjustment layers with different thicknesses are formed by photolithography, the optical adjustment layers are preferably formed before the formation of a layer containing a light-emitting organic compound.

For example, in a structure in which a reflective film is provided on the substrate side, an optical adjustment layer is preferably provided between the reflective film and one of a pair of electrodes between which a layer containing a light-emitting organic compound is interposed; in a structure in which a semi-transmissive and semi-reflective film is provided on the substrate side, the optical adjustment layer is preferably provided between the semi-transmissive and semi-reflective film and the other of the pair of electrodes.

The use of photolithography makes it possible to arrange optical adjustment layers with different thicknesses in a minute pattern. As a result, a light-emitting panel which includes a high-definition light-emitting element and is capable of multicolor light emission can be provided.

Note that when the thickness of the layer containing a light-emitting organic compound is increased, the layer can also serve as the thinnest optical adjustment layer of the optical adjustment layers provided in the light-emitting panel. Specifically, in the light-emitting panel 150, by increasing the thickness of the layer 103 containing a light-emitting organic compound, the layer 103 containing a light-emitting organic compound can also serves as the optical adjustment layer 113c of the third light-emitting element 130. As a result, one of the pair of electrodes can be provided in contact with the reflective film 111c.

Further, by increasing the thickness of the layer 103 containing a light-emitting organic compound, the layer 103 containing a light-emitting organic compound can also serve as the optical adjustment layer 113c of the third light-emitting element 130, and the reflective film 111c can also serve as one of the pair of electrodes.

The number of optical adjustment layers with different thicknesses is reduced in a light-emitting panel in which a layer containing a light-emitting organic compound also function as the thinnest optical adjustment layer; thus, the light-emitting panel is easily manufactured.

In the case where optical adjustment layers with different thicknesses are formed by an evaporation method or a sputtering method which uses a shadow mask method (also referred to as metal mask method), the optical adjustment layers may be formed before or after the formation of a layer containing a light-emitting organic compound, and the optical adjustment layers can also be provided in the layer containing a light-emitting organic compound.

A formation method using a shadow mask method is preferably used, in which case diffusion of impurities such as moisture into a layer containing a light-emitting organic compound is difficult to occur, which makes it possible to provide optical adjustment layers in a variety of positions and to increase the degree of freedom of a manufacturing process.

3. Structure of Pair of Electrodes and Layer Containing Light-Emitting Organic Compound Interposed Therebetween A pair of electrodes and a layer containing a light-emitting organic compound interposed between the pair of electrodes are included in an organic EL element. Organic EL elements with a variety of structures can be applied to one embodiment of the present invention, and the detail will be described in Embodiment 4.

4. Structure of Layer Transmitting Red Light

The layer 115 transmitting red light is provided in a position overlapping with the semi-transmissive and semi-reflective film of the second light-emitting element 120. A red color filter can be used as the layer 115 transmitting red light. For example, an organic resin layer in which a pigment is dispersed may be used as the layer 115 transmitting red light.

In the second light-emitting element 120, the optical path length of a microresonator formed by the pair of the reflective film 111b and the semi-transmissive and semi-reflective film 112 is adjusted to N/2 (N is a natural number) of the length greater than or equal to 600 nm and less than 800 nm. As a result, mixed light including light with a wavelength greater than or equal to 600 nm and less than 800 nm and light with a wavelength greater than or equal to 400 nm and less than 600 nm, which are intensified by the microresonator, is transmitted through the semi-transmissive and semi-reflective film. The layer 115 transmitting red light, which is provided in the position overlapping with the semi-transmissive and semi-reflective film, extracts red light from the mixed light.

5. Modification Example

Here, a case where an optical adjustment layer also serves as one of a pair of electrodes will be described with reference to FIG. 1B. A first light-emitting element 210 includes an optical adjustment layer 213a and a layer 203 containing a light-emitting organic compound between a reflective film 211a and a semi-transmissive and semi-reflective film 212a. Note that the optical path length of the first light-emitting element 210 illustrated in FIG. 1B depends on the distance between the reflective film 211a and the semi-transmissive and semi-reflective film 212a (indicated by an arrow 251).

An optical adjustment layer transmitting light with a wavelength greater than or equal to 400 nm and less than 800 nm and has electrical conductivity can be used as either of a pair of electrodes. In the first light-emitting element 210 illustrated in FIG. 1B, the optical adjustment layer 213a also serves as one of a pair of electrodes. As a result, a light-emitting panel which has a simplified structure and is capable of multicolor light emission can be provided.

The optical adjustment layer which also serves as either of the pair of electrodes can be formed using, for example, a conductive film containing indium oxide, indium tin oxide (ITO), indium zinc oxide, zinc oxide, zinc oxide to which gallium is added (GZO), zinc oxide to which aluminum is added (AZO), or the like. A film formed using graphene, nanowhisker of a conductive material, or the like can be used other than the above materials.

Further, when a reflective film is formed using a conductive material and is electrically connected to one of a pair of electrodes, an increase in drive voltage of a light-emitting panel, which is caused due to the electrical resistance (e.g., sheet resistance) of the one of the pair of electrodes, can be suppressed. As a result, a light-emitting panel whose power consumption is reduced and which is capable of multicolor display can be provided.

Figure 1B:
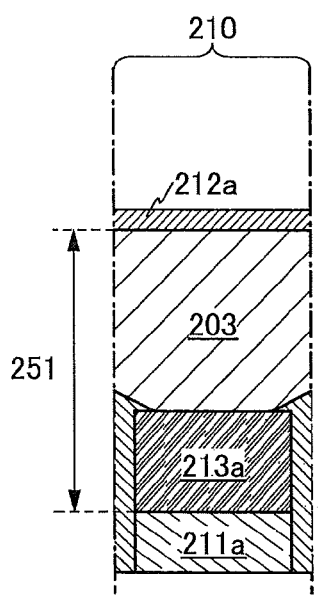

In the first light-emitting element 210 illustrated in FIG. 1B, the optical adjustment layer 213a having electrical conductivity is stacked over the conductive reflective film 211a. As an example of such a structure, a structure can be given in which indium tin oxide (ITO) is stacked as the optical adjustment layer 213a over the reflective film 211a in which a titanium film is stacked over an aluminum film.

This structure can provide a simplified structure and suppress an increase in drive voltage even in the case where a transparent conductive film has relatively high electrical resistance.

Further, when a structure is employed in which a semi-transmissive and semi-reflective film is formed using a material which has electrical conductivity and partly reflects and partly transmits light with a wavelength greater than or equal to 400 nm and less than 800 nm, the semi-transmissive and semi-reflective film can be used as the other of the pair of electrodes. As a result, a light-emitting panel which has a simplified structure and is capable of multicolor light emission can be provided.

In the first light-emitting element 210 illustrated in FIG. 1B, the conductive semi-transmissive and semi-reflective film 212a also serves as the other of the pair of electrodes. As a result, a light-emitting panel which has a simplified structure and is capable of multicolor light emission can be provided.

For example, the semi-transmissive and semi-reflective film which can also serve as the other of the pair of electrodes can be formed to a thickness greater than or equal to 0.1 nm and less than 100 nm using a material similar to that of the reflective film. A metal which can inject carriers to the layer containing a light-emitting organic compound can also be used. For example, silver, an alloy of silver and magnesium (Mg—Ag alloy), and the like are preferable because they each have a work function suitable for carrier injection as well as capability of being easily formed into a uniform thin film.

The light-emitting panel of one embodiment of the present invention includes the first light-emitting element which emits mixed light including light with a wavelength greater than or equal to 600 nm and less than 800 nm and light with a wavelength greater than or equal to 400 nm and less than 600 nm, which are intensified between the pair of the reflective film and the semi-transmissive and semi-reflective film; the second light-emitting element which emits red light obtained by extracting the mixed light through the layer transmitting red light; and the third light-emitting element which emits light with a wavelength greater than or equal to 400 nm and less than 600 nm, which is intensified between the pair of the reflective film and the semi-transmissive and semi-reflective film.

Thus, a light-emitting panel can be obtained in which the first light-emitting element emits light having high brightness and a pale color and causing less eyestrain even in the case of long-time use, the second light-emitting element emits light of a bright red color, and the third light-emitting element emits light of a bright color different from the color of the light emitted from the first light-emitting element and the red color of the light emitted from the second light-emitting element. Further, a layer transmitting light of a specific color is not provided in all the light-emitting elements except the second light-emitting element; thus, light emitted from the layer containing a light-emitting organic compound can be efficiently used. As a result, a light-emitting panel which is capable of multicolor light emission and whose power consumption is reduced can be provided.

Note that this embodiment can be freely combined with any of the other embodiments in this specification.

Embodiment 2

In this embodiment, a light-emitting panel including a first light-emitting element, a second light-emitting element, a third light-emitting element, and a fourth light-emitting element will be described with reference to FIG. 2. In the first light-emitting element, a layer containing a light-emitting organic compound, which is interposed between a pair of electrodes and emits light including light with a wavelength greater than or equal to 400 nm and less than 500 nm, light with a wavelength greater than or equal to 500 nm and less than 600 nm, and light with a wavelength greater than or equal to 600 nm and less than 800 nm, is provided between a pair of a reflective film and a semi-transmissive and semi-reflective film, the optical path length between which is N/2 (N is a natural number) of the length greater than or equal to 600 nm and less than 800 nm. In the second light-emitting element, the layer containing a light-emitting organic compound is provided between a pair of a reflective film and the semi-transmissive and semi-reflective film, the optical path length between which is N/2 (N is a natural number) of the length greater than or equal to 600 nm and less than 800 nm, and a layer transmitting red light is further provided so as to overlap with the semi-transmissive and semi-reflective film. In the third light-emitting element, the layer containing a light-emitting organic compound is provided between a pair of a reflective film and the semi-transmissive and semi-reflective film, the optical path length between which is N/2 (N is a natural number) of the length greater than or equal to 500 nm and less than 600 nm. The third light-emitting element emits green light with high saturation. In the fourth light-emitting element, the layer containing a light-emitting organic compound is provided between a pair of a reflective film and the semi-transmissive and semi-reflective film, the optical path length between which is N/2 (N is a natural number) of the length greater than or equal to 400 nm and less than 500 nm. The fourth light-emitting element emits blue light with high saturation.

The description will be given on, specifically, a light-emitting panel including a first light-emitting element, a second light-emitting element, a third light-emitting element, and a fourth light-emitting element in each of which an optical adjustment layer and a layer containing a light-emitting organic compound interposed between a pair of electrodes are provided between a pair of a reflective film and a semi-transmissive and semi-reflective film. The layer containing a light-emitting organic compound emits light including light with a wavelength greater than or equal to 600 nm and less than 800 nm, light with a wavelength greater than or equal to 500 nm and less than 600 nm, and light with a wavelength greater than or equal to 400 nm and less than 500 nm. The first light-emitting element and the second light-emitting element have an equal optical path length between the pair of the reflective film and the semi-transmissive and semi-reflective film of N/2 (N is a natural number) of the length greater than or equal to 600 nm and less than 800 nm. In the second light-emitting element, a layer transmitting red light is provided so as to overlap with the semi-transmissive and semi-reflective film. The optical path length between the pair of the reflective film and the semi-transmissive and semi-reflective film in the third light-emitting element is N/2 (N is a natural number) of the length greater than or equal to 500 nm and less than 600 nm. The optical path length between the pair of the reflective film and the semi-transmissive and semi-reflective film in the fourth light-emitting element is N/2 (N is a natural number) of the length greater than or equal to 400 nm and less than 500 nm.

Figure 2:
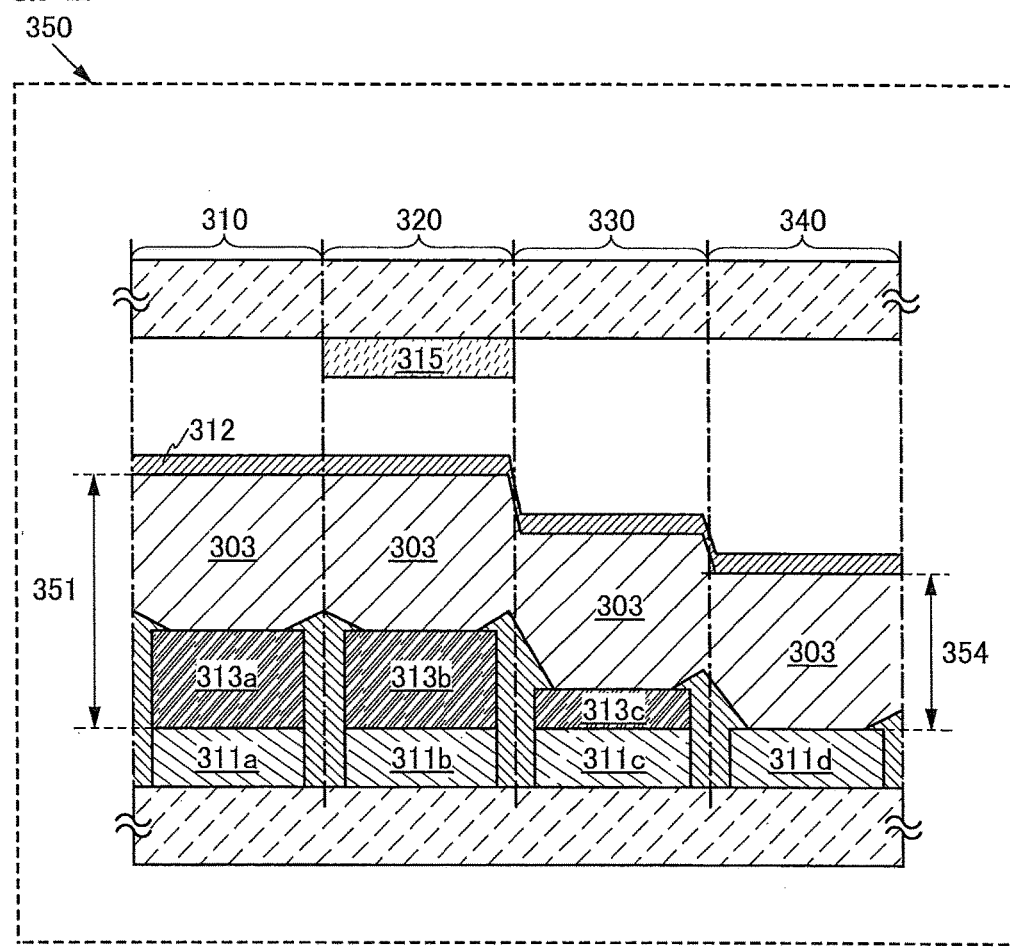
FIG. 2 illustrates a structure of a light-emitting panel according to Embodiment.

FIG. 2 illustrates a structure of a light-emitting panel of one embodiment of the present invention. The light-emitting panel illustrated in FIG. 2 includes a first light-emitting element 310, a second light-emitting element 320, a third light-emitting element 330, and a fourth light-emitting element 340.

The first light-emitting element 310 includes an optical adjustment layer 313a between a reflective film 311a and a semi-transmissive and semi-reflective film 312. The optical adjustment layer 313a also serves as one of a pair of electrodes, and the semi-transmissive and semi-reflective film 312 also serves as the other of the pair of electrodes. A layer 303 containing a light-emitting organic compound is provided between the optical adjustment layer 313a and the semi-transmissive and semi-reflective film 312.

The second light-emitting element 320 includes an optical adjustment layer 313b between a reflective film 311b and the semi-transmissive and semi-reflective film 312. The optical adjustment layer 313b also serves as one of a pair of electrodes, and the semi-transmissive and semi-reflective film 312 also serves as the other of the pair of electrodes. The layer 303 containing a light-emitting organic compound is provided between the optical adjustment layer 313b and the semi-transmissive and semi-reflective film 312.

The third light-emitting element 330 includes an optical adjustment layer 313c between a reflective film 311c and the semi-transmissive and semi-reflective film 312. The optical adjustment layer 313c also serves as one of a pair of electrodes, and the semi-transmissive and semi-reflective film 312 also serves as the other of the pair of electrodes. The layer 303 containing a light-emitting organic compound is provided between the optical adjustment layer 313c and the semi-transmissive and semi-reflective film 312.

The fourth light-emitting element 340 includes the layer 303 containing a light-emitting organic compound between a reflective film 311d and the semi-transmissive and semi-reflective film 312. The layer 303 containing a light-emitting organic compound also serves as an optical adjustment layer, the reflective film 311d also serves as one of a pair of electrodes, and the semi-transmissive and semi-reflective film 312 also serves as the other of the pair of electrodes.

Further, the second light-emitting element 320 includes a layer 315 transmitting red light on the semi-transmissive and semi-reflective film 312 side.

Note that the optical path length of the first light-emitting element 310 of the light-emitting panel 350 illustrated in FIG. 2 depends on the distance between the reflective film 311a and the semi-transmissive and semi-reflective film 312 (indicated by an arrow 351). The optical path length of the fourth light-emitting element 340 depends on the distance between the reflective film 311d and the semi-transmissive and semi-reflective film 312 (indicated by an arrow 353).

Note that a so-called tandem structure is preferably employed as the structure of the layer containing a light-emitting organic compound which emits light including light with a wavelength greater than or equal to 600 nm and less than 800 nm, light with a wavelength greater than or equal to 500 nm and less than 600 nm, and light with a wavelength greater than or equal to 400 nm and less than 500 nm.

The "tandem structure" here means a structure in which at least two layers containing light-emitting organic compounds and an intermediate layer are included and the intermediate layer is interposed between the layers containing light-emitting organic compounds.

The intermediate layer may be formed to include at least a charge generation region and may have a structure in which a charge generation region and a layer other than the charge generation region are stacked. For example, a structure in which a first charge generation region, an electron-relay layer, and an electron-injection buffer are stacked in this order over a cathode is one embodiment of the intermediate layer.

The reason why the tandem structure is preferable as the structure of the layer containing a light-emitting organic compound is described below. Plural kinds of light-emitting organic compounds need to be used in order to obtain emission of light with a variety of wavelengths from the layer containing a light-emitting organic compound. However, when plural kinds of light-emitting organic compounds are used close to each other, uniform emissions cannot be obtained from the light-emitting organic compounds due to mutual interaction.

In view of the above, plural kinds of light-emitting organic compounds need to be dispersed apart from each other in the layer containing a light-emitting organic compound. For example, there is a method in which the thickness of a layer contributing light emission (referred to as light-emitting layer) is increased and plural kinds of light-emitting organic compounds are dispersed. However, when the thickness of the light-emitting layer is simply increased, drive voltage becomes extremely high, which causes a decrease in emission efficiency with respect to electric power.

In contrast, when the tandem structure is used, an increase in drive voltage is slow and current flowing through the element is kept constant; thus, a decrease in emission efficiency can be suppressed. Moreover, when the tandem structure is used, the thickness of a layer other than the light-emitting layer can be changed more freely. As a result, the layer containing light-emitting organic compounds can be used as part of the optical adjustment layer and the light-emitting panel can be designed more freely, which is convenient.

The light-emitting panel of one embodiment of the present invention includes the first light-emitting element which emits mixed light including light with a wavelength greater than or equal to 600 nm and less than 800 nm and light with a wavelength greater than or equal to 400 nm and less than 600 nm, which are intensified between the pair of the reflective film and the semi-transmissive and semi-reflective film; the second light-emitting element which emits red light obtained by extracting the mixed light through the layer transmitting red light; the third light-emitting element which emits light with a wavelength greater than or equal to 500 nm and less than 600 nm, which is intensified between the pair of the reflective film and the semi-transmissive and semi-reflective film; and the fourth light-emitting element which emits light with a wavelength greater than or equal to 400 nm and less than 500 nm which is intensified between the pair of the reflective film and the semi-transmissive and semi-reflective film.

Thus, a light-emitting panel can be obtained in which the first light-emitting element emits light having high brightness and a pale color and causing less eyestrain even in the case of long-time use, the second light-emitting element emits light of a bright red color, the third light-emitting element emits green light, and the fourth light-emitting element emits blue light. Further, a layer transmitting light of a specific color is not provided in all the light-emitting elements except the second light-emitting element; thus, light emitted from the layer containing a light-emitting organic compound can be efficiently used. In particular, when mixed light including light with a wavelength greater than or equal to 600 nm and less than 800 nm and light with a wavelength greater than or equal to 400 nm and less than 600 nm is created, the first light-emitting element can create the mixed light more efficiently than in the case where any two of the other light-emitting elements emit light. Thus, in the case where light of a color located at the center or near the center of the chromaticity diagram (e.g., white) is created, when the light is created by mixing light emitted from the first light-emitting element with light emitted from one of the other light-emitting elements, the power consumption of the whole panel can be reduced. As a result, a light-emitting panel which is capable of bright, full-color light emission and whose power consumption is reduced can be provided.

Embodiment 3

Figure 3A:
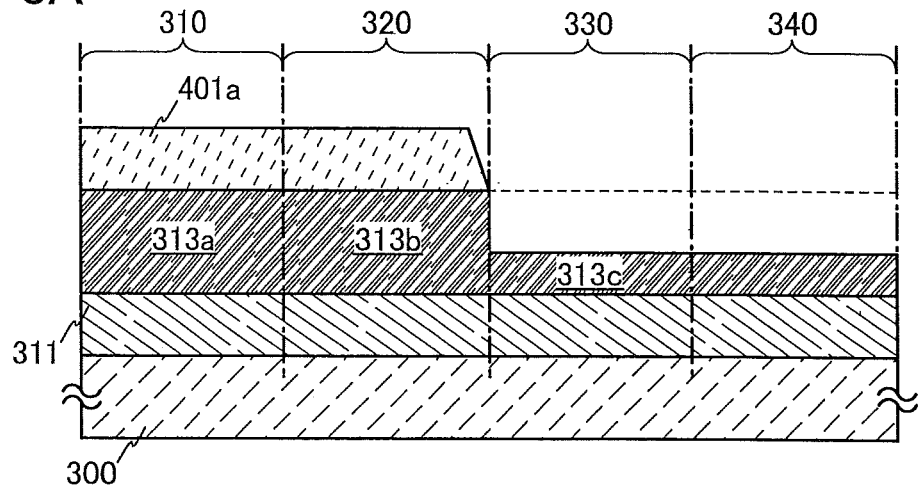
FIGS. 3A to 3C illustrate a method for manufacturing a light-emitting panel according to an embodiment.
Figure 3B:
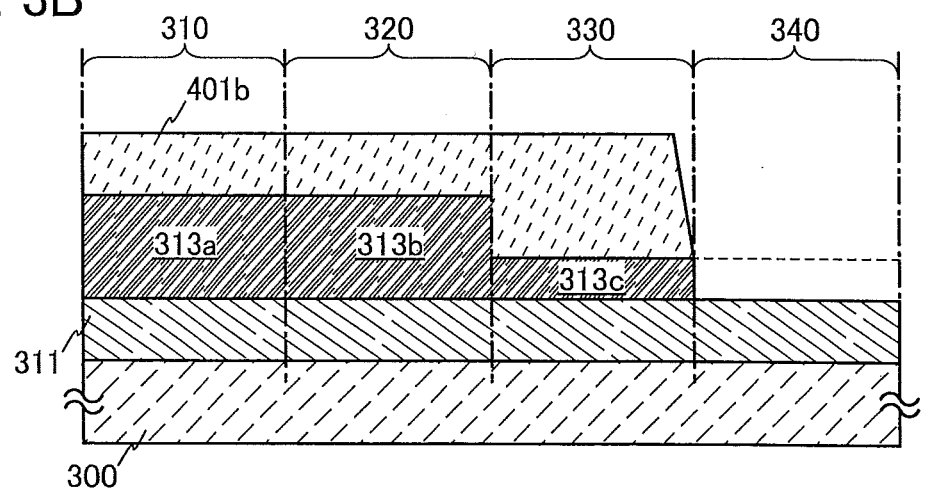
Figure 3C:
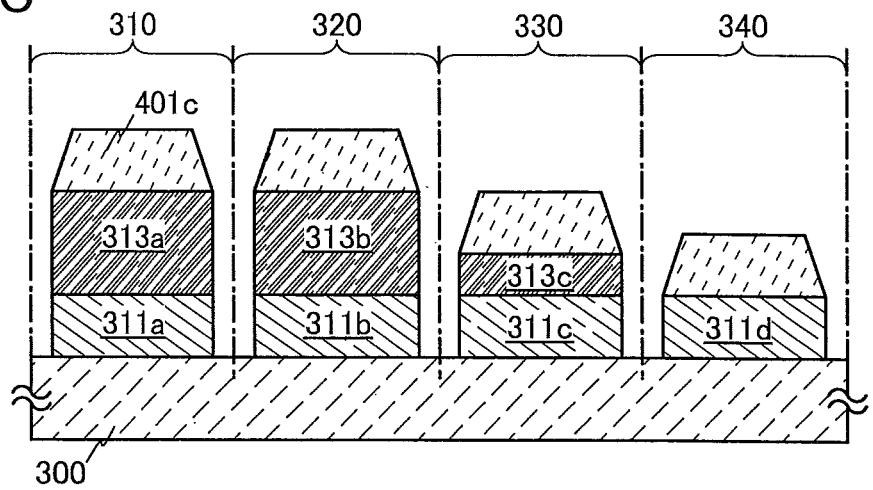

In this embodiment, a method for manufacturing a light-emitting panel including a first light-emitting element, a second light-emitting element, a third light-emitting element, and a fourth light-emitting element will be described with reference to FIGS. 3A to 3C. In the first light-emitting element, a layer containing a light-emitting organic compound, which is interposed between a pair of electrodes and emits light including light with a wavelength greater than or equal to 400 nm and less than 500 nm, light with a wavelength greater than or equal to 500 nm and less than 600 nm, and light with a wavelength greater than or equal to 600 nm and less than 800 nm, is provided between a pair of a reflective film and a semi-transmissive and semi-reflective film, the optical path length between which is N/2 (N is a natural number) of the length greater than or equal to 600 nm and less than 800 nm. In the second light-emitting element, the layer containing a light-emitting organic compound is provided between a pair of a reflective film and the semi-transmissive and semi-reflective film, the optical path length between which is N/2 (N is a natural number) of the length greater than or equal to 600 nm and less than 800 nm, and a layer transmitting red light is further provided so as to overlap with the semi-transmissive and semi-reflective film. In the third light-emitting element, the layer containing a light-emitting organic compound is provided between a pair of a reflective film and the semi-transmissive and semi-reflective film, the optical path length between which is N/2 (N is a natural number) of the length greater than or equal to 500 nm and less than 600 nm. The third light-emitting element emits green light with high saturation. In the fourth light-emitting element, the layer containing a light-emitting organic compound is provided between a pair of a reflective film and the semi-transmissive and semi-reflective film, the optical path length between which is N/2 (N is a natural number) of the length greater than or equal to 400 nm and less than 500 nm. The fourth light-emitting element emits blue light with high saturation.

<First Step>

In the first step, a reflective film is formed over a substrate. The reflective film may be formed using any of the materials given in Embodiment 1 by a method suitable for the material. In this embodiment, a conductive reflective film 311 is formed over a glass substrate 300 by a sputtering method. A stacked film in which a titanium film is stacked over an aluminum-titanium alloy film can be given as an example of the conductive reflective film 311.

<Second Step>

In the second step, an optical adjustment layer is formed over the reflective film. The optical adjustment layer may be formed using any of the materials given in Embodiment 1 by a method suitable for the material. The thicknesses of the optical adjustment layers provided in the first light-emitting element and the second light-emitting element are the same. In this embodiment, as the optical adjustment layer, a light-transmitting conductive film is formed over the conductive reflective film 311 by a sputtering method. As an example of the light-transmitting conductive film, a film of indium tin oxide (ITO) can be given.

<Third Step>

In the third step, the optical adjustment layer 313c which is thinner than the optical adjustment layers provided in regions serving as the first light-emitting element and the second light-emitting element is formed in a region serving as the third light-emitting element. In this embodiment, a resist mask 401a covering the regions serving as the first light-emitting element and the second light-emitting element is formed, and then the thickness of the optical adjustment layer in the region serving as the third light-emitting element is reduced. As a method for reducing the thickness, for example, dry etching is performed for a predetermined length of time under conditions which have been set for a predetermined etching rate. Note that FIG. 3A illustrates a structure at this point.

<Fourth Step>

In the fourth step, an optical adjustment layer in a region serving as the fourth light-emitting element is thinned so as to be thinner than the optical adjustment layer provided in the region serving as the third light-emitting element. In this embodiment, a resist mask 401b covering the regions serving as the first to third light-emitting elements is formed, and then the optical adjustment layer in the region serving as the fourth light-emitting element is removed by etching. Note that FIG. 3B illustrates a structure at this point.

Next, the reflective film 311 and the optical adjustment layer (313a, 313b, and 313c) are etched using a resist mask 401c to form an electrode serving as one of the pair of electrodes. Specifically, division of the reflective film and division of the optical adjustment layer are performed so that the reflective film 311a and the optical adjustment layer 313a are included in the region serving as the first light-emitting element; the reflective film 311b and the optical adjustment layer 313b are included in the region serving as the second light-emitting element; the reflective film 311c and the optical adjustment layer 313c are included in the region serving as the third light-emitting element; and the reflective film 311d is included in the region serving as the fourth light-emitting element. Note that FIG. 3C illustrates a structure at this point.

Next, a partition wall 304 is formed. The partition wall 304 has an opening portion on a surface of one of the pair of electrodes included in each of the first light-emitting element 310 to the fourth light-emitting element 340. The partition wall 304 can have a variety of shapes. Typically, the partition wall 304 can have a shape by which the layer containing a light-emitting organic compound and/or the other of the pair of electrodes are/is cut so as to be divided in the adjacent light-emitting elements, or a shape by which the layer containing a light-emitting organic compound and/or the other of the pair of electrodes are/is prevented from being cut so as to be continued in the adjacent light-emitting elements.

In order to cut the layer containing a light-emitting organic compound and/or the other of the pair of electrodes, for example, the partition wall 304 may have a shape in which a stage portion, which is positioned over a leg portion in contact with the other of the pair of electrodes, extends beyond the leg portion in a direction parallel to the substrate surface, specifically, a shape such as an inverted tapered shape or an eaves shape.

Figure 4A:
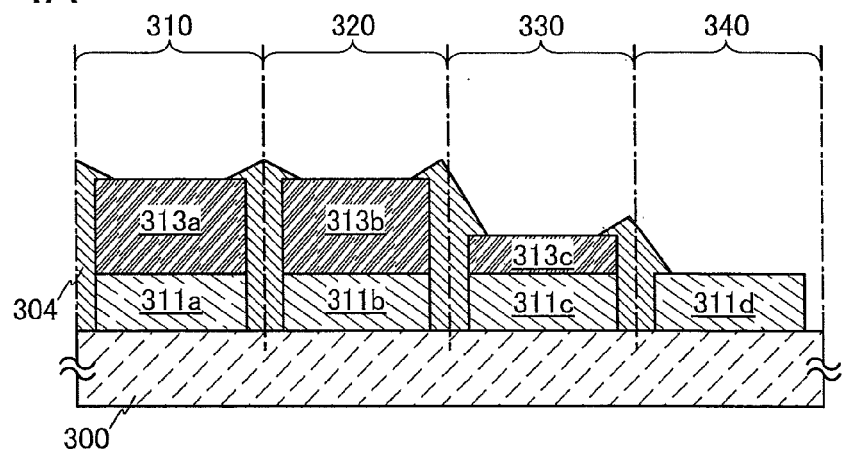
FIGS. 4A and 4B illustrate a method for manufacturing a light-emitting panel according to an embodiment.

In order to prevent the layer containing a light-emitting organic compound and/or the other of the pair of electrodes from being cut, for example, the partition wall 304 may have a taper angle of an edge portion, which is in contact with the one of the pair of electrodes, of greater than or equal to 10° and less than or equal to 85°, preferably greater than or equal to 60° and less than or equal to 80°. Note that FIG. 4A illustrates a structure at this point.

<Fifth Step>

In the fifth step, the layer 303 containing a light-emitting organic compound, which emits light including light with a wavelength greater than or equal to 600 nm and less than 800 nm, light with a wavelength greater than or equal to 500 nm and less than 600 nm, and light with a wavelength greater than or equal to 400 nm and less than 500 nm, is formed in contact with the optical adjustment layer 313a of the first light-emitting element 310, the optical adjustment layer 313b of the second light-emitting element 320, the optical adjustment layer 313c of the third light-emitting element 330, and the reflective film 311d of the fourth light-emitting element 340.

The layer 303 containing a light-emitting organic compound is formed using any of the materials given in Embodiment 1 or Embodiment 4 by a method suitable for the material. As a formation method of the layer 303 containing a light-emitting organic compound, a printing method including an inkjet method, or the like can be used as well as a vacuum evaporation method or a coating method.

Note that the layer 303 containing a light-emitting organic compound, which emits white light, is formed in this embodiment.

<Sixth Step>

In the sixth step, the conductive semi-transmissive and semi-reflective film 312 is formed so as to be in contact with the layer 303 containing a light-emitting organic compound and to overlap with the optical adjustment layer 313a of the first light-emitting element 310, the optical adjustment layer 313b of the second light-emitting element 320, the optical adjustment layer 313c of the third light-emitting element 330, and the reflective film 311d of the fourth light-emitting element 340. The semi-transmissive and semi-reflective film 312 may be formed in such a manner that a metal film is formed by adjusting its thickness so that the metal film partly reflects and partly transmits light with a wavelength greater than or equal to 400 nm and less than 800 nm.

<Seventh Step>

Figure 4B:
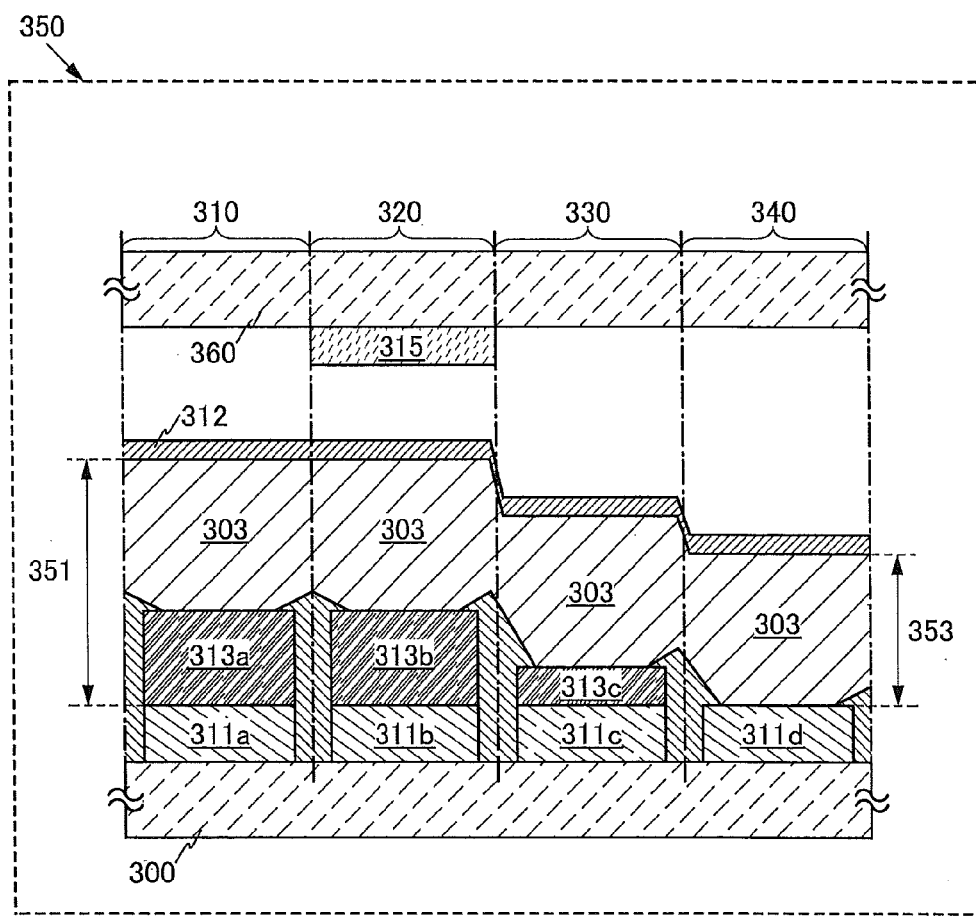

In the seventh step, the layer 315 transmitting red light is provided so as to overlap with the semi-transmissive and semi-reflective film 312 of the second light-emitting element 320. The layer 315 transmitting red light is provided in such a manner that a sealing substrate 360 provided with the layer 315 transmitting red light is bonded so that the layer 315 transmitting red light overlaps with the semi-transmissive and semi-reflective film 312 of the second light-emitting element 320 and the position of the sealing substrate 360 is adjusted to the position of the glass substrate 300. Through the above steps, the light-emitting panel 350 of one embodiment of the present invention is manufactured. FIG. 4B illustrates the structure of the light-emitting panel 350.

According to the method for manufacturing the light-emitting panel of one embodiment of the present invention, layers containing light-emitting organic compounds do not need to be formed separately for individual light-emitting elements; thus, a metal mask (also referred to as shadow mask) is not used. As a result, a light-emitting panel can be manufactured through a simple process and with high yields.

Further, a light-emitting element is formed by photolithography before a layer containing a light-emitting organic compound is formed; thus, a high-definition light-emitting element can be easily formed.

By a step of forming the two kinds of optical adjustment layers with different thicknesses and a step of forming a red color filter, a light-emitting panel including four kinds of light-emitting elements which emit light of different colors (specifically, light-emitting elements which emits light of red, green, blue, and a pale color with high brightness) can be manufactured. As a result, a simple method for manufacturing a light-emitting panel capable of full-color light emission can be provided.

Note that this embodiment can be freely combined with any of the other embodiments in this specification.

Embodiment 4

In this embodiment, an example of a structure of the layer 103 containing a light-emitting organic compound interposed between a pair of electrodes, which can be used in a light-emitting panel of one embodiment of the present invention will be described with reference to FIGS. 5A to 5C and FIGS. 6A and 6B. In this embodiment, a pair of electrodes and a layer containing alight-emitting organic compound interposed between the pair of electrodes are collectively referred to as light-emitting unit.

The light-emitting unit described as an example in this embodiment includes a first electrode, a second electrode, and a layer containing a light-emitting organic compound (hereinafter referred to as EL layer) provided between the first electrode and the second electrode. One of the first electrode and the second electrode serves as an anode, and the other serves as a cathode. The EL layer is provided between the first electrode and the second electrode, and a structure of the EL layer may be selected as appropriate in accordance with materials of the first electrode and second electrode. An example of the structure of the light-emitting unit will be described below; it is needless to say that the structure of the light-emitting unit is not limited to this example.

<Structure Example 1 of Light-Emitting Unit>

Figure 5A:
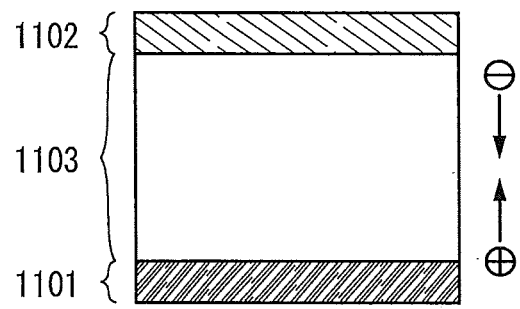
FIGS. 5A to 5C each illustrate a layer containing a light-emitting organic compound interposed between a pair of electrodes according to an embodiment.

FIG. 5A illustrates an example of a structure of a light-emitting unit. In the light-emitting unit illustrated in FIG. 5A, an EL layer 1103 is interposed between an anode 1101 and a cathode 1102.

When voltage higher than the threshold voltage of the light-emitting unit is applied between the anode 1101 and the cathode 1102, holes are injected to the EL layer 1103 from the anode 1101 side and electrons are injected to the EL layer 1103 from the cathode 1102 side. The injected electrons and holes recombine in the EL layer 1103, so that a light-emitting substance contained in the EL layer 1103 emits light.

The EL layer 1103 may include at least a light-emitting layer containing a light-emitting substance, and may have a structure in which a layer other than the light-emitting layer and the light-emitting layer are stacked. Examples of the layer other than the light-emitting layer include layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having a high electron-transport property and a high hole-transport property).

Figure 5B:
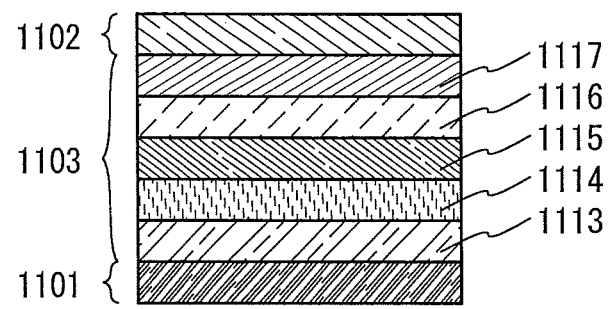

FIG. 5B illustrates an example of a specific structure of the EL layer 1103. The EL layer 1103 illustrated in FIG. 5B has a structure in which a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-Emitting Unit>

Figure 5C:
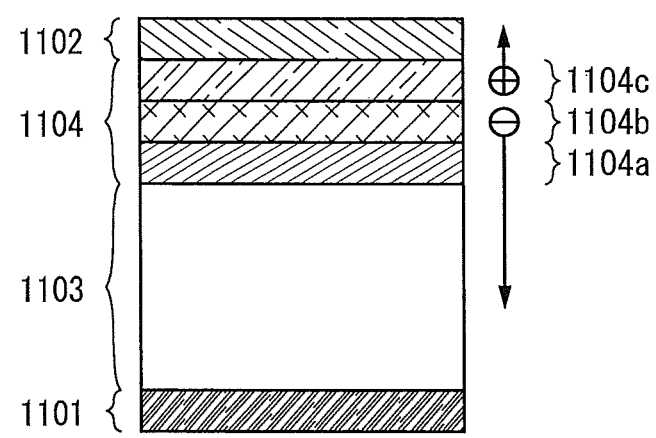

FIG. 5C illustrates another example of a structure of the light-emitting unit. In the light-emitting element illustrated as an example in FIG. 5C, the EL layer 1103 is interposed between the anode 1101 and the cathode 1102. In addition, an intermediate layer 1104 is provided between the cathode 1102 and the EL layer 1103. Note that a structure similar to that in Structure Example 1 of the light-emitting unit can be applied to the EL layer 1103 in Structure Example 2 of the light-emitting unit and that the description of Structure Example 1 of the light-emitting unit can be referred to for the details.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behavior of electrons and holes in the intermediate layer 1104 is described. When voltage higher than the threshold voltage of the light-emitting unit is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the EL layer 1103, so that the efficiency of the electron injection into the EL layer 1103 can be improved. Thus, the electrons generated in the first charge generation region 1104c are injected into the LUMO level of the EL layer 1103 through the electron-relay layer 1104b and the electron-injection buffer 1104a.

Further, the electron-relay layer 1104b can prevent interaction in which the substance included in the first charge generation region 1104c and the substance included in the electron-injection buffer 1104a react with each other at the interface therebetween to impair the functions of the first charge generation region 1104c and the electron-injection buffer 1104a.

The range of choices of materials that can be used for the cathode in Structure Example 2 of the light-emitting unit is wider than that of materials that can be used for the cathode in Structure Example 1 of the light-emitting unit. This is because the cathode in Structure Example 2 may receive holes generated by the intermediate layer and a material having a relatively high work function can be used.

<Structure Example 3 of Light-Emitting Unit>

Figure 6A:
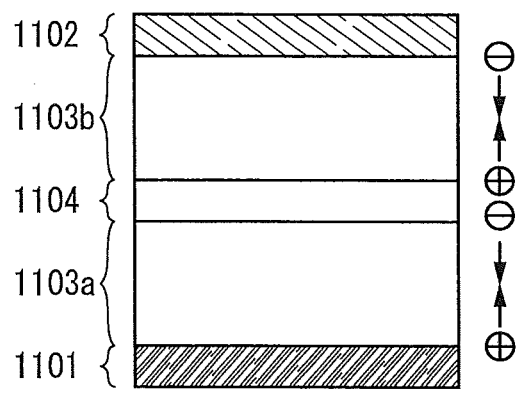
FIGS. 6A and 6B each illustrate a layer containing a light-emitting organic compound interposed between a pair of electrodes according to an embodiment.
Figure 6B:
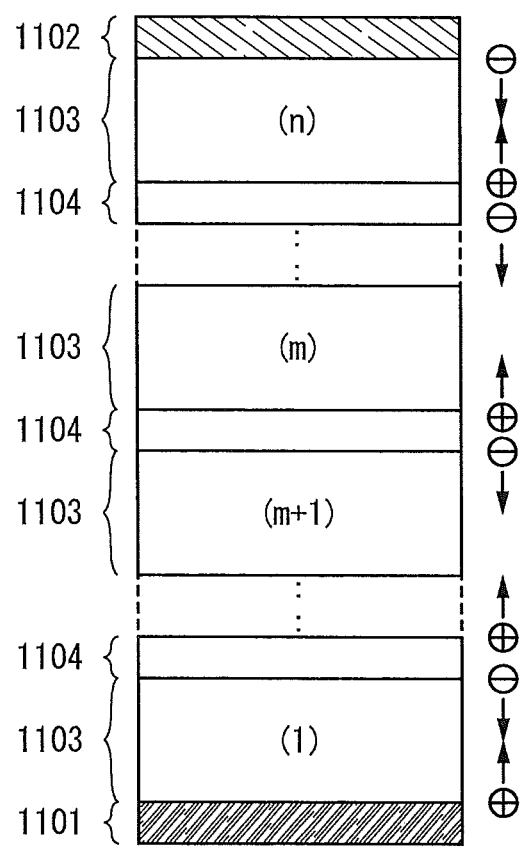

FIG. 6A illustrates another example of a structure of a light-emitting unit. In the light-emitting element illustrated as an example in FIG. 6A, two EL layers are provided between the anode 1101 and the cathode 1102. In addition, the intermediate layer 1104 is provided between the EL layer 1103a and the EL layer 1103b.

Note that the number of EL layers provided between the anode and the cathode is not limited to two. A light-emitting unit which is illustrated as an example in FIG. 6B has a structure in which a plurality of EL layers 1103 are stacked, that is, a so-called tandem structure. Note that in the case where n (n is a natural number of 2 or more) EL layers 1103 are provided between the anode and the cathode, the intermediate layer 1104 is provided between an m-th (m is a natural number greater than or equal to 1 and less than or equal to n−1) EL layer and an (m+1)-th EL layer.

Note that a structure similar to that in Structure Example 1 of the light-emitting unit can be applied to the EL layer 1103 in Structure Example 3 of the light-emitting unit; a structure similar to that in Structure Example 2 of the light-emitting unit can be applied to the intermediate layer 1104 in Structure Example 3 of the light-emitting unit. Therefore, the description of Structure Example 1 of the light-emitting unit or the description of Structure Example 2 of the light-emitting unit can be referred to for the details.

The behavior of electrons and holes in the intermediate layer 1104 provided between the EL layers is described. When voltage higher than the threshold voltage of the light-emitting unit is applied between the anode 1101 and the cathode 1102, holes and electrons are generated in the intermediate layer 1104, and the holes move into the EL layer which is provided on the cathode 1102 side and the electrons move into the EL layer which is provided on the anode 1101 side. The holes injected into the EL layer which is provided on the cathode side are recombined with the electrons injected from the cathode side, so that the light-emitting substance contained in the EL layer emits light. The electrons injected into the EL layer which is provided on the anode side are recombined with the holes injected from the anode side, so that the light-emitting substance contained in the EL layer emits light. Thus, the holes and electrons generated in the intermediate layer 1104 cause light emission in the respective EL layers.

Note that in the case where a structure which is the same as an intermediate layer is formed between the EL layers by providing the EL layers that are in contact with each other, the EL layers can be formed to be in contact with each other. Specifically, when a charge generation region is formed on one surface of the EL layer, the charge generation region functions as a first charge generation region of an intermediate layer; thus, the EL layers can be formed to be in contact with each other.

Structure Examples 1 to 3 of the light-emitting units can be implemented in combination. For example, an intermediate layer may be provided between the cathode and the EL layer in Structure Example 3 of the light-emitting unit.

<Materials for Light-Emitting Unit>

Next, specific materials that can be used for the light-emitting unit having the above structure will be described.

Materials for the anode, the cathode, the EL layer, the first charge generation region, the electron-relay layer, and the electron-injection buffer will be described in this order.

<Material for Anode>

The anode 1101 is preferably formed using a metal, an alloy, an electrically conductive compound, a mixture of these materials, or the like which has a high work function (specifically, a work function higher than or equal to 4.0 eV is more preferable). Specifically, as examples of thereof, indium oxide-tin oxide Indium tin oxide; ITO), indium tin oxide containing silicon or silicon oxide, indium zinc oxide (IZO), indium oxide containing tungsten oxide and zinc oxide (IWZO), and the like are given.

Films of these conductive metal oxides are usually formed by a sputtering method, but may also be formed by application of a sol-gel method or the like. For example, a film of indium oxide-zinc oxide can be formed by a sputtering method using a target in which zinc oxide is added to indium oxide at 1 wt % or more and 20 wt % or less. A film of indium oxide containing tungsten oxide and zinc oxide can be formed by a sputtering method using a target in which tungsten oxide and zinc oxide are added to indium oxide at 0.5 wt % or more and 5 wt % or less and 0.1 wt % or more and 1 wt % or less, respectively.

Besides, as examples of materials used for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly (3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be described later together with a material for forming the first charge generation region.

<Material for Cathode>

In the case where the first charge generation region 1104c is provided between the cathode 1102 and the EL layer 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. A metal thin film with a thickness enough to transmit light (preferably, approximately greater than or equal to 5 nm and less than or equal to 30 nm) can also be used.

<Material for EL Layer>

Specific examples of the materials for the layers included in the EL layer 1103 will be given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. A material for forming the second charge generation region will be described later together with a material for forming the first charge generation region.

The hole-transport layer is a layer containing a substance having a high hole-transport property. As examples of the material having a high hole-transport property, the following can be given: aromatic amine compounds such as 4,4'-bis [N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP)], 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl) amino]-9-phenylcarbazole (abbreviation: PCzPCN1); and the like. In addition, carbazole derivatives such as 4,4'-di (N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA), and the like can be given. The substances given here are mainly ones that have a hole mobility of $10^{-6}$ $cm^2/Vs$ or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl) benzidine] (abbreviation: Poly-TPD) can be used for the hole-transport layer.

The light-emitting layer contains a light-emitting substance. As the light-emitting substance, any of the following fluorescent compounds can be used, for example: N,N'-bis [4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,N'-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-

4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30; N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1, F-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and SD1 (product name; manufactured by SFC Co., Ltd.).

As the light-emitting substance, any of the following phosphorescent compounds can also be used, for example: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5-bistrifluoromethylphenyl)pyridinato-N,C$^{2'}$]iridium(III)picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIracac), tris(2-phenylpyridinato)iridium(III) (abbreviation: Ir(ppy)$_3$), bis(2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$ (acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum (II) (abbreviation: PtOEP), tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenyl)-3,3,3-trifluoroacetonato](monophenanthroline)europium(III) (abbreviation: Eu(TTA)$_3$(Phen)), and (dipivaloylmethanato)bis(2,3,5-triphenylpyrazinato)iridium(III) (abbreviation: Ir(tppr)$_2$ (dpm)).

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP); a substance having a high hole-transport property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer is a layer containing a substance having a high electron-transport property. As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can be used. Besides the metal complex, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like can be used. The substances given here are mainly ones that have an electron mobility of $10^{-6}$ cm$^2$/Vs or higher. Note that any other substances may also be used as long as the electron-transport property thereof is higher than the hole-transport property thereof. The electron-transport layer is not limited to a single layer and may be a stack of two or more layers containing any of the above substances.

High molecular compounds can also be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer is a layer containing a substance having a high electron-injection property. As examples of the substance having a high electron-injection property, the following can be given: n alkali metal or an alkaline earth metal such as lithium (Li), cesium (Cs), calcium (Ca), lithium fluoride (LiF), cesium fluoride (CsF), and calcium fluoride ($CaF_2$), and a compound thereof. Alternatively, a layer containing a substance having an electron-transport property and an alkali metal, an alkaline earth metal, magnesium (Mg), or a compound thereof (e.g., Alq containing magnesium (Mg)) can be used. Such a structure makes it possible to increase the efficiency of electron injection from the cathode 1102.

As a method for forming the EL layer 1103 by combining these layers as appropriate, any of a variety of methods (e.g., a dry process and a wet process) can be selected as appropriate. For example, a vacuum evaporation method, an inkjet method, a spin coating method, or the like may be selected in accordance with a material to be used. Further, a different formation method may be employed for each layer.

<Material for Charge Generation Region>

The first charge generation region 1104c and the second charge generation region are regions containing a substance having a high hole-transport property and an acceptor substance. The charge generation region may not only include a substance having a high hole-transport property and an acceptor substance in the same film but also includes a stacked layer of a layer containing a substance having a high hole-transport property and a layer containing an acceptor substance. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As examples of the acceptor substance that is used for the charge generation region, a transition metal oxide and an oxide of a metal belonging to Groups 4 to 8 of the periodic table can be given. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ $cm^2/Vs$ or higher is preferably used. Note that any other substances may also be used as long as the hole-transport property thereof is higher than the electron-transport property thereof.

<Material for Electron-Relay Layer>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level thereof is positioned between the acceptor level of the acceptor substance in the first charge generation region 1104c and the LUMO level of the EL layer 1103. Specifically, it is preferable that the LUMO level of the electron-relay layer 1104b be approximately greater than or equal to −5.0 eV and less than or equal to −3.0 eV.

As examples of the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used because such a compound further facilitates reception of electrons in the electron-relay layer 1104b.

As specific examples of the perylene derivative, the following can be given: 3,4,9,10-perylenetetracarboxylic dianhydride (PTCDA), 3,4,9,10-perylenetetracarboxylic bisbenzimidazole (PTCBI), N,N'-dioctyl-3,4,9,10-perylenetetracarboxylic diimide (PTCDI-C8H), and N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatri-phenylene ($HAT(CN)_6$), 2,3-diphenylpyrido[2,3-b]pyrazine (2PYPR), and 2,3-bis(4-fluorophenyl)pyrido[2,3-b]pyrazine (F2PYPR).

Other than the above, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: $F_{16}CuPc$), N,N'-bis(2,2,3,3,4,4,5,5,6,6,7,7,8,8-pentadeca-fluorooctyl)-1,4,5,8-naphthalenetetracarboxylic diimide (abbreviation: NTCDI-C8F), 3',4'-dibutyl-5,5''-bis(dicya-nomethylene)-5,5''-dihydro-2,2':5''2''-terthiophen (abbreviation: DCMT), methanofullerenes (e.g., [6,6]-phenyl $C_{61}$ butyric acid methyl ester), or the like can be used for the electron-relay layer 1104b.

<Material for Electron-Injection Buffer>

The electron-injection buffer 1104a is a layer which facilitates electron injection from the first charge generation region 1104c into the EL layer 1103. When the electron-injection buffer 1104a is provided between the first charge generation region 1104c and the EL layer 1103, the injection barrier therebetween can be reduced.

Any of the following substances having a high electron injection property can be used for the electron-injection buffer 1104a: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron-injection buffer 1104a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-transport property, a material similar to the above material for the electron-transport layer which can be formed in part of the EL layer 1103 can be used.

The light-emitting unit described in this embodiment can be manufactured by combination of the above-described materials. Light emission from the above light-emitting substance can be obtained with this light-emitting element, and the emission color can be selected by changing the type of the light-emitting substance. Further, when a plurality of light-emitting substances which emit light of different colors are used, the width of the emission spectrum can be expanded and, for example, white light emission can be obtained. Note that in order to obtain white light emission, light-emitting substances which emit light of complementary colors may be used, for example, layers which emit light of complementary colors, or the like can be used. Specific examples of complementary colors include blue and yellow, blue-green and red, and the like.

Note that this embodiment can be freely combined with any of the other embodiments in this specification.

Embodiment 5

In this embodiment, a light-emitting device including a light-emitting panel including a first light-emitting element, a second light-emitting element, and a third light-emitting element will be described with reference to FIGS. 7A and 7B and FIGS. 8A and 8B. In the first light-emitting element, a layer containing a light-emitting organic compound, which is interposed between a pair of electrodes and emits light including light with a wavelength greater than or equal to 400 nm and less than 600 nm and light with a wavelength greater than or equal to 600 nm and less than 800 nm, is provided between a pair of a reflective film and a semi-transmissive and semi-reflective film, the optical path length between which is N/2 (N is a natural number) of the length greater than or equal to 600 nm and less than 800 nm. In the second light-emitting element, the layer containing a light-emitting organic compound is provided between a pair of a reflective film and the semi-transmissive and semi-reflective film, the optical path length between which is N/2 (N is a natural number) of the length greater than or equal to 600 nm and less than 800 nm, and a layer transmitting red light is further provided so as to overlap with the semi-transmissive and semi-reflective film. In the third light-emitting element, the layer containing a light-emitting organic compound is provided between a pair of a reflective film and the semi-transmissive and semi-reflective film, the optical path length between which is N/2 (N is a natural number) of the length greater than or equal to 400 nm and less than 600 nm. The third light-emitting element emits light with high saturation and of a color different from red. Specifically, an active matrix light-emitting device and a passive matrix light-emitting device will be described. Therefore, in this embodiment, the first light-emitting element, the second light-emitting element, and the third light-emitting element can also be referred to as a first pixel, a second pixel, and a third pixel, respectively.

<Active Matrix Light-Emitting Device>

FIGS. 7A and 7B illustrate a structure in the case where the light-emitting panel of one embodiment of the present invention is applied to an active matrix light-emitting device. FIG. 7A is a top view of the light-emitting device and FIG. 7B is a cross-sectional view along lines A-B and C-D of FIG. 7A.

An active matrix light-emitting device 1400 includes a driver circuit portion (source side driver circuit) 1401, a pixel portion 1402, a driver circuit portion (gate side driver circuit) 1403, a sealing substrate 1404, and a sealant 1405 (see FIG. 7A). Note that a portion enclosed by the sealant 1405 is a space.

The light-emitting device 1400 receives a video signal, a clock signal, a start signal, a reset signal, and the like from a flexible printed circuit (FPC) 1409 that is an external input terminal. Note that although only the FPC is shown here, the FPC may be provided with a printed wiring board (PWB). The light-emitting device in this specification includes, in its category, not only a light-emitting device itself but also a light-emitting device provided with the FPC or the PWB.

Next, the structure of the light-emitting device will be described with reference to the cross-sectional view of FIG. 7B. The light-emitting device 1400 includes a driver circuit portion including the source side driver circuit 1401 illustrated over an element substrate 1410 and the pixel portion 1402 including a pixel illustrated. Further, the light-emitting device 1400 includes a lead wiring 1408 for transmitting signals that are to be inputted to the source side driver circuit 1401 and the gate side driver circuit 1403.

Note that although the source side driver circuit 1401 includes a CMOS circuit in which an n-channel TFT 1423 and a p-channel TFT 1424 are combined in this embodiment, the driver circuit is not limited to this structure and may be any of a variety of circuits, such as a CMOS circuit, a PMOS circuit, or an NMOS circuit. Further, although a driver-integrated type in which a driver circuit is formed over the substrate is described in this embodiment, the present invention is not limited thereto, and the driver circuit can be formed outside the substrate.

The pixel portion 1402 is formed using the light-emitting panel of one embodiment of the present invention. The light-emitting panel includes a plurality of pixels each of which includes a switching TFT 1411, a current control TFT 1412, and a first electrode 1413 electrically connected to a drain of the current control TFT 1412. As a structure of the light-emitting panel provided in the pixel portion 1402, for example, the structure described as an example in Embodiment 1 can be employed. Specifically, a structure in which a switching TFT is provided in each of the light-emitting elements included in the light-emitting panel described as an example in Embodiment 1 may be employed. Note that a partition wall 1414 is formed so as to cover an end portion of the first electrode 1413. Here, the partition wall 1414 is formed using a positive type photosensitive acrylic resin film.

Further, the partition wall 1414 is formed so as to have a curved surface with curvature at an upper end portion or a lower end portion thereof. For example, when positive type photosensitive acrylic is used as the material of the partition wall 1414, it is preferable that the partition wall 1414 have a curved surface with a curvature radius (0.2 μm to 3 μm) only at the upper end portion. The partition wall 1414 can be formed using either a negative type photosensitive resin which becomes insoluble in an etchant by light irradiation or a positive type photosensitive resin which becomes soluble in an etchant by light irradiation.

In the light-emitting device 1400, a second electrode 1417 is provided over a first electrode 1413, and a layer 1416 containing a light-emitting organic compound is provided between the first electrode 1413 and the second electrode 1417, whereby a light-emitting element 1418 is formed. As a structure of the light-emitting element 1418, for example, the structure of the light-emitting element included in the light-emitting panel described as an example in Embodiment 1 can be employed.

The light-emitting device 1400 described as an example in this embodiment has a structure in which the light-emitting element 1418 included in the light-emitting panel of one embodiment of the present invention is sealed in a space 1407 enclosed by the element substrate 1410, the sealing substrate 1404, and the sealant 1405. Note that the space 1407 is filled with a filler and may be filled with an inert gas (e.g., nitrogen or argon) or the sealant 1405. A material for adsorbing impurities, such as a desiccant, may be provided.

It is desirable that the sealant 1405 and the sealing substrate 1404 be formed using a material which allows as little impurity in the air (e.g., moisture or oxygen) as possible to transmit. As examples of the sealing substrate 1404, in addition to a glass substrate and a quartz substrate, a plastic substrate formed using fiberglass-reinforced plastics (FRP), polyvinyl fluoride (PVF), polyester, acrylic, and the like can be given. As the sealant 1405, typically, an epoxy-based resin is preferably used.

In the above-described active matrix light-emitting device of one embodiment of the present invention, a light-emitting panel can be formed in which the first light-emitting element emits light having high brightness and a pale color and causing less eyestrain even in the case of long-time use, the second light-emitting element emits light of a bright red color, and the third light-emitting element emits light of a bright color which is different from the colors of the light emitted from the first light-emitting element and the second light-emitting element. Further, a layer transmitting light of a specific color (e.g., color filter) is not provided in all the light-emitting elements except the second light-emitting element; thus, light emitted from the layer containing a light-emitting organic compound can be efficiently used. As a result, a light-emitting device which is capable of multicolor light emission and whose power consumption is reduced can be provided. Further, the use of the light-emitting device makes it possible to provide a display device which causes less eyestrain even in the case of long-time use and whose power consumption is reduced.

<Passive Matrix Light-Emitting Device>

Figure 8A:
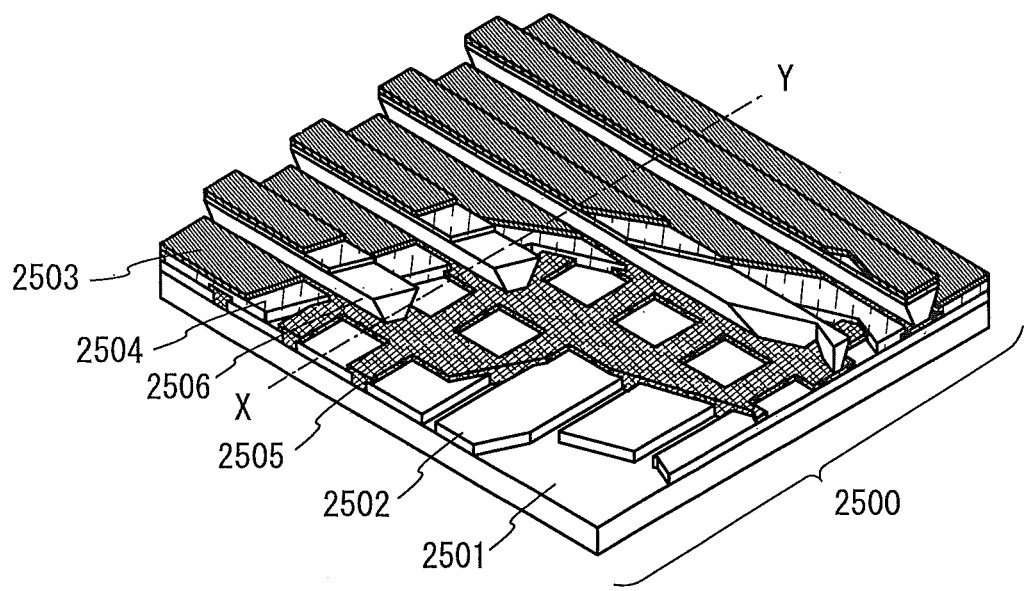
FIGS. 8A and 8B illustrate a light-emitting device to which a light-emitting panel according to an embodiment is applied.
Figure 8B:
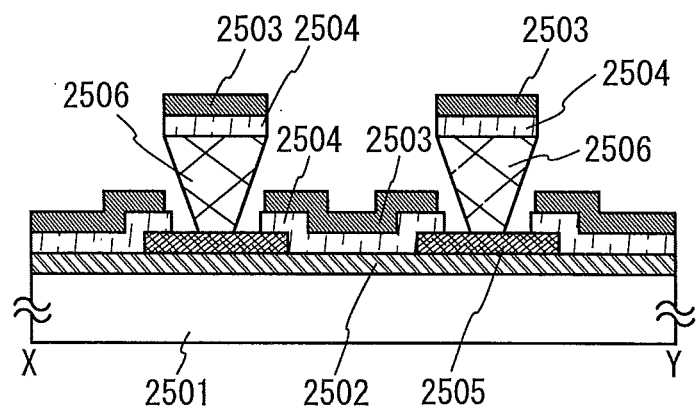

FIGS. 8A and 8B illustrate a structure in the case where the light-emitting panel of one embodiment of the present invention is applied to a passive matrix light-emitting device. Note that FIG. 8A is a perspective view of the light-emitting device and FIG. 8B is a cross-sectional view along line X-Y in FIG. 8A.

A passive matrix light-emitting device 2500 includes a first electrode 2502 over a substrate 2501. Further, an insulating layer 2505 is provided so as to cover an end portion of the first electrode 2502, and a partition layer 2506 is provided over the insulating layer 2505.

The light-emitting device 2500 is manufactured using the light-emitting panel of one embodiment of the present invention. As a structure of the light-emitting panel, for example, the structure described as an example in Embodiment 1 can be employed. The second electrode 2503 is provided over the first electrode 2502, and a layer 2504 containing a light-emitting organic compound is provided between the first electrode 2502 and the second electrode 2503, so that a light-emitting element is formed. As a structure of the light-emitting element, for example, the structure of the light-emitting element included in the light-emitting panel described as an example in Embodiment 1 can be employed.

The sidewalls of the partition layer 2506 slope so that the distance between one sidewall and the other sidewall gradually decreases toward the surface of the substrate. In other words, a cross section taken along the direction of the short side of the partition layer 2506 is trapezoidal, and the base (side facing in a direction parallel to the plane direction of the insulating layer 2505 and being in contact with the insulating layer 2505) is shorter than the upper side (side facing in the direction parallel to the plane direction of the insulating layer 2505 and not being in contact with the insulating layer 2505). With the partition layer 2506 provided as described above, a defect of the light-emitting element due to crosstalk or the like can be prevented.

In the above-described passive matrix light-emitting device of one embodiment of the present invention, a light-emitting panel can be formed in which the first light-emitting element emits light having high brightness and a pale color and causing less eyestrain even in the case of long-time use, the second light-emitting element emits light of a bright red color, and the third light-emitting element emits light of a bright color which is different from the colors of the light emitted from the first light-emitting element and the second light-emitting element. Further, a layer transmitting light of a specific color (e.g., color filter) is not provided in all the light-emitting elements except the second light-emitting element; thus, light emitted from the layer containing a light-emitting organic compound can be efficiently used. As a result, a light-emitting device which is capable of multicolor light emission and whose power consumption is reduced can be provided. Further, the use of the light-emitting device makes it possible to provide a display device which causes less eyestrain even in the case of long-time use and whose power consumption is reduced.

Note that this embodiment can be freely combined with any of the other embodiments in this specification.

Embodiment 6

In this embodiment, an example of a light-emitting device in which a light-emitting panel of one embodiment of the present invention is incorporated will be described with reference to FIGS. 9A to 9E.

Examples of the electronic devices to which the light-emitting device is applied are television devices (also referred to as TVs or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices are illustrated in FIGS. 9A to 9E.

Figure 9A:
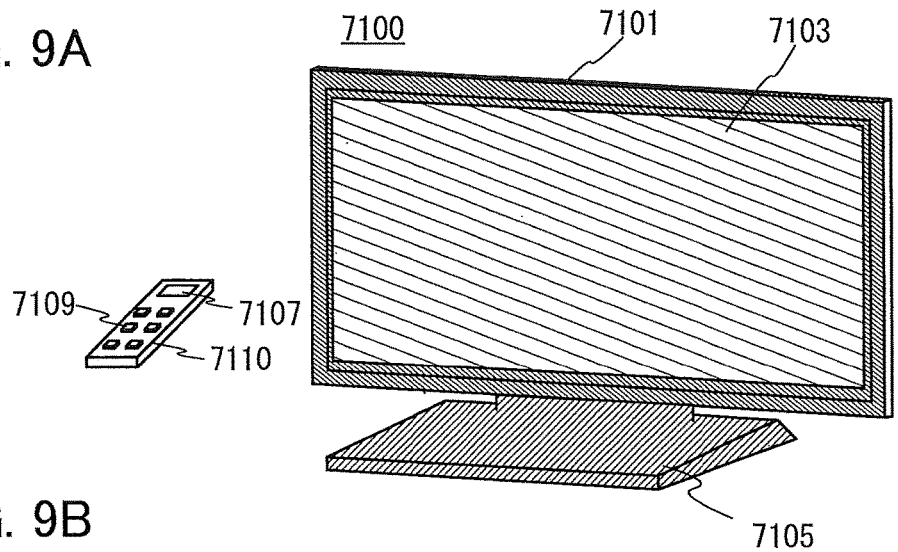
FIGS. 9A to 9E each illustrate an electronic device to which a light-emitting panel according to an embodiment t is applied.

FIG. 9A illustrates an example of a television device. In a television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled, so that images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figures 9B, 9C:
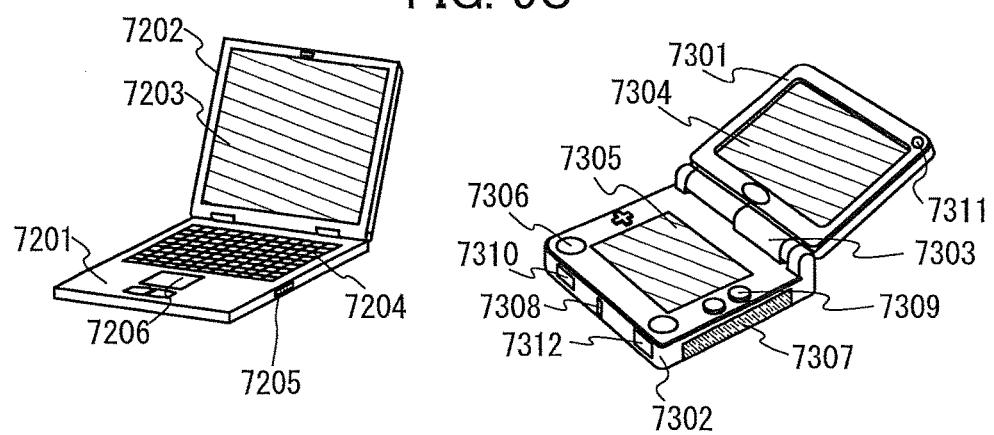

FIG. 9B illustrates a computer, which includes a main body 7201, a housing 7202, a display portion 7203, a keyboard 7204, an external connecting port 7205, a pointing device 7206, and the like. This computer is manufactured by using the light-emitting device for the display portion 7203.

FIG. 9C illustrates a portable game machine including two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 9C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 9C has a function of reading out a program or data stored in a storage medium to display it on the display portion, and a function of sharing information with another portable game machine by wireless communication. Note that the portable game machine in FIG. 9C can have a variety of functions without limitation to the above.

Figures 9D, 9E:
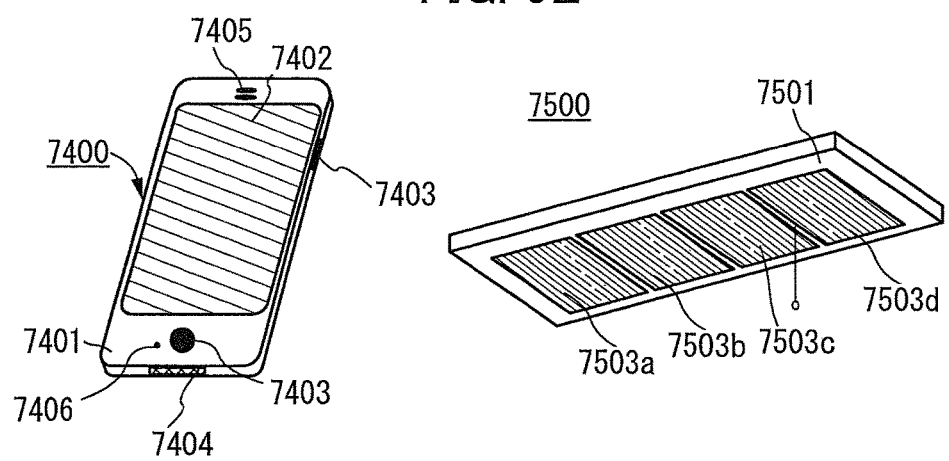

FIG. 9D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 9D is touched with a finger or the like, data can be input into the mobile phone 7400. Further, users can make a call and compose an e-mail by touching the display portion 7402 with a finger or the like.

There are mainly three screen modes of the display portion 7402. The first mode is a display mode mainly for displaying images. The second mode is an input mode mainly for inputting information such as characters. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 can function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

FIG. 9E illustrates an example of a lighting device. In a lighting device 7500, light-emitting devices 7503a to 7503d of one embodiment of the present invention are incorporated in a housing 7501 as light sources. The lighting device 7500 can be attached to a ceiling, a wall, or the like.

The light-emitting device of one embodiment of the present invention includes a light-emitting panel in a thin film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

In the above-described light-emitting device of one embodiment of the present invention, a light-emitting panel can be formed in which the first light-emitting element emits light having high brightness and a pale color and causing less eyestrain even in the case of long-time use, the second light-emitting element emits light of a bright red color, and the third light-emitting element emits light of a bright color which is different from the colors of the light emitted from the first light-emitting element and the second light-emitting element. Further, a layer transmitting light of a specific color (e.g., color filter) is not provided in all the light-emitting elements except the second light-emitting element; thus, light emitted from the layer containing a light-emitting organic compound can be efficiently used. As a result, a light-emitting device which is capable of multicolor light emission and whose power consumption is reduced can be provided.

Note that this embodiment can be freely combined with any of the other embodiments in this specification.

Embodiment 7

In this embodiment, an example of a light-emitting device in which a light-emitting panel of one embodiment of the present invention is incorporated will be described with reference to FIGS. 10A and 10B. Specifically, a light-emitting device (a lighting device or a lighting equipment) used for lighting will be described.

According to one embodiment of the present invention, a lighting device in which a light-emitting portion has a curved surface can be obtained.

One embodiment of the present invention can also be applied to lighting in a car; for example, lighting can be easily mounted on a dashboard, a ceiling, or the like.

Figure 10A:
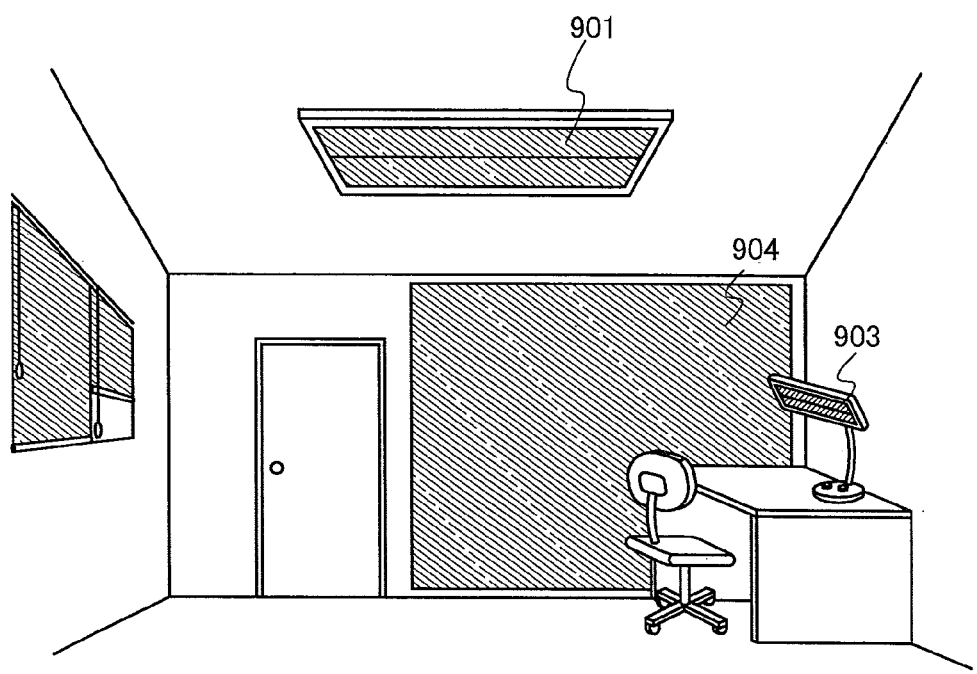
FIGS. 10A and 10B each illustrate an electronic device to which a light-emitting panel according to an embodiment is applied.

FIG. 10A illustrates an interior lighting device 901 provided on a ceiling, a lighting device 904 provided on a wall surface, and a desk lamp 903 to which one embodiment of the present invention is applied. Since the light-emitting device can have a larger area, it can be used as a lighting device having a large area.

Figure 10B:
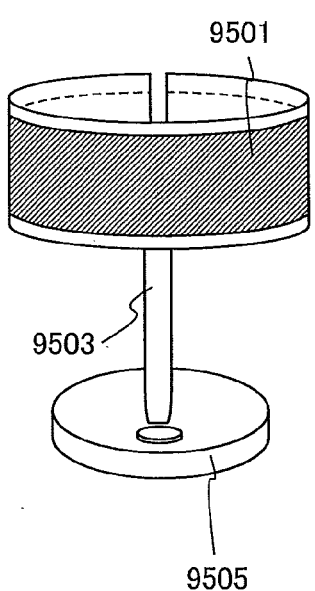

FIG. 10B illustrates another example of a lighting device. A desk lamp illustrated in FIG. 10B includes a lighting portion 9501, a support 9503, a support base 9505, and the like. The lighting portion 9501 includes the light-emitting panel of one embodiment of the present invention. According to one embodiment of the present invention, a lighting device having a curved surface can be obtained.

Example

Structures of light-emitting elements that can be used in the light-emitting panel of one embodiment of the present invention, a method for manufacturing the light-emitting elements, and measurement results of the characteristics of the light-emitting elements will be described.

Structures of four light-emitting elements included in a light-emitting panel manufactured in this example will be described with reference to FIGS. 11A and 11B and Table 1.

<Structure of Light-Emitting Element>

Figure 11A:
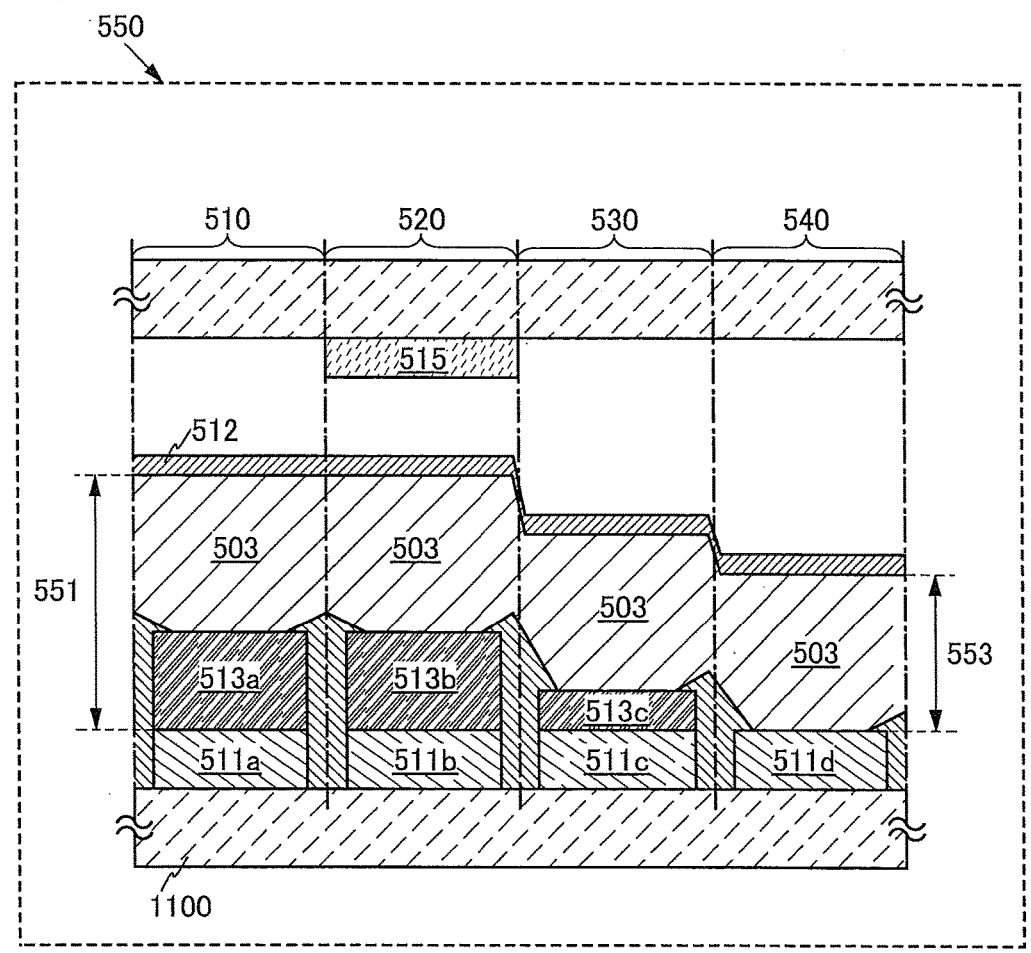
FIGS. 11A and 11B illustrate a structure of a light-emitting element according to Example.

FIG. 11A illustrates structures of the four light-emitting elements. A first light-emitting element 510 includes an optical adjustment layer 513a between a reflective film 511a and a semi-transmissive and semi-reflective film 512. The optical adjustment layer 513a also serves as one of a pair of electrodes, and the semi-transmissive and semi-reflective film 512 also serves as the other of the pair of electrodes. In addition, a layer 503 containing a light-emitting organic compound is provided between the optical adjustment layer 513a and the semi-transmissive and semi-reflective film 512.

The second light-emitting element 520 includes an optical adjustment layer 513b between a reflective film 511b and the semi-transmissive and semi-reflective film 512. The optical adjustment layer 513b also serves as one of a pair of electrodes, and the semi-transmissive and semi-reflective film 512 also serves as the other of the pair of electrodes. In addition, the layer 503 containing a light-emitting organic compound is provided between the optical adjustment layer 513b and the semi-transmissive and semi-reflective film 512. Furthermore, a layer transmitting red light is provided so as to overlap with the semi-transmissive and semi-reflective film.

A third light-emitting element 530 includes an optical adjustment layer 513c between a reflective film 511c and the semi-transmissive and semi-reflective film 512. The optical adjustment layer 513c also serves as one of a pair of electrodes, and the semi-transmissive and semi-reflective film 512 also serves as the other of the pair of electrodes. In addition, the layer 503 containing a light-emitting organic compound is provided between the optical adjustment layer 513c and the semi-transmissive and semi-reflective film 512.

A fourth light-emitting element 540 includes the layer 503 containing a light-emitting organic compound between a reflective film 511d and the semi-transmissive and semi-reflective film 512. The layer 503 containing a light-emitting organic compound also serves as an optical adjustment layer, the reflective film 511d also serves as one of a pair of electrodes, and the semi-transmissive and semi-reflective film 512 also serves as the other of the pair of electrodes.

The optical adjustment layers which are included in the first light-emitting element 510, the second light-emitting element 520, and the third light-emitting element 530 and each of which serves as the one of the pair of electrodes were all formed using indium tin oxide containing silicon (ITSO). The thickness of each of the optical adjustment layer 513a and the optical adjustment layer 513b was 70 nm and the thickness of the optical adjustment layer 513c was 30 nm. Note that in this example, for example, the optical path length of the first light-emitting element 510 depends on the distance between the reflective film 511a and the semi-transmissive and semi-reflective film 512 (indicated by an arrow 551) and the optical path length of the fourth light-emitting element 540 depends on the distance between the reflective film 511d and the semi-transmissive and semi-reflective film 512 (indicated by an arrow 553).

<Structure of Layer Containing Light-Emitting Organic Compound>

Figure 11B:
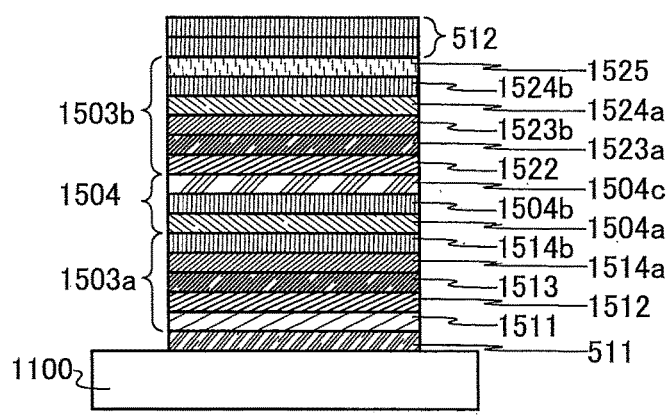

FIG. 11B illustrates a structure of the layer containing a light-emitting organic compound. The layer 503 containing a light-emitting organic compound has a structure in which two EL layers (a first EL layer 1503a and a second EL layer 1503b) are provided so as to interpose an intermediate layer (an intermediate layer 1504) therebetween (the structure is also referred to as tandem structure). Note that the first EL layer 1503a, the second EL layer 1503b, and the intermediate layer 1504 are provided between reflective film 511 and semi-transmissive and semi-reflective film 512.

The first EL layer 1503a includes a hole-injection layer 1511, a first hole-transport layer 1512, a first light-emitting layer 1513, a first electron-transport layer 1514a, and a second electron-transport layer 1514b in this order over a conductive film serving as one of a pair of electrodes.

The intermediate layer 1504 includes an electron-injection buffer 1504a, an electron-relay layer 1504b, and a charge-generation region 1504c in this order over the electron-transport layer 1514b.

The second EL layer 1503b includes a second hole-transport layer 1522, a second light-emitting layer 1523a, a third light-emitting layer 1523b, a third electron-transport layer 1524a, a fourth electron-transport layer 1524b, and an electron-injection layer 1525 in this order over the intermediate layer 1504.

Table 1 shows details of materials included in the EL layers.

TABLE 1

| | First EL layer 1503a | | | | |
|---|---|---|---|---|---|
| | | | | Electron-transport layer | |
| | Hole-injection layer 1511 | Hole-transport layer 1512 | First light-emitting layer 1513 | First electron-transport layer 1514a | Second electron-transport layer 1514b |
| EL layer | CzPA:MoOx (=2:1) 30 nm | PCzPA 20 nm | PA:1.6-mMemFLPAP (=1:0.05) 30 nm | CzPA 5 nm | Bphen 15 nm |

| Intermediate layer 1504 | | | Second EL layer 1503b | | |
|---|---|---|---|---|---|
| Electron-injection buffer layer 1504a | Electron-relay layer 1504b | Charge-generation region 1504c | Hole-transport layer 1522 | Light-emitting layer | |
| | | | | Second light-emitting layer 1523a | Third light-emitting layer 1523b |
| Ca 1 nm | CuPc 2 nm | CzPA:MoOx (=2:1) 30 nm | BPAFLP 20 nm | 2mDBTPDBqII:Ir(mppm)2acac 0.8:0.2:0.06 20 nm | 2mDBTPDBqII:Ir(tppr)2dpm 1:0.02 20 nm |

| Second EL layer 1503b | | |
|---|---|---|
| Electron-transport layer | | |
| Third electron-transport layer 1524b | Fourth electron-injection layer 1525 | Electron- |
| 2mDBTPDBqII 15 nm | Bphen 15 nm | LiF 1 nm |

Shown below are structural formulae of some of the organic compounds used in this example.

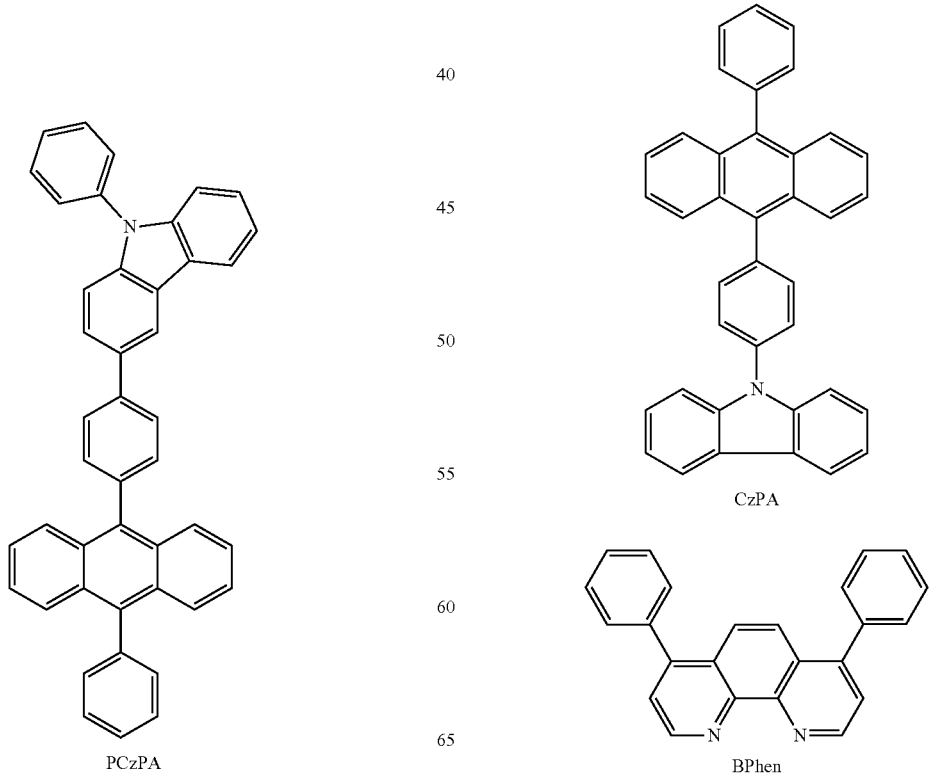

PCzPA

CzPA

BPhen

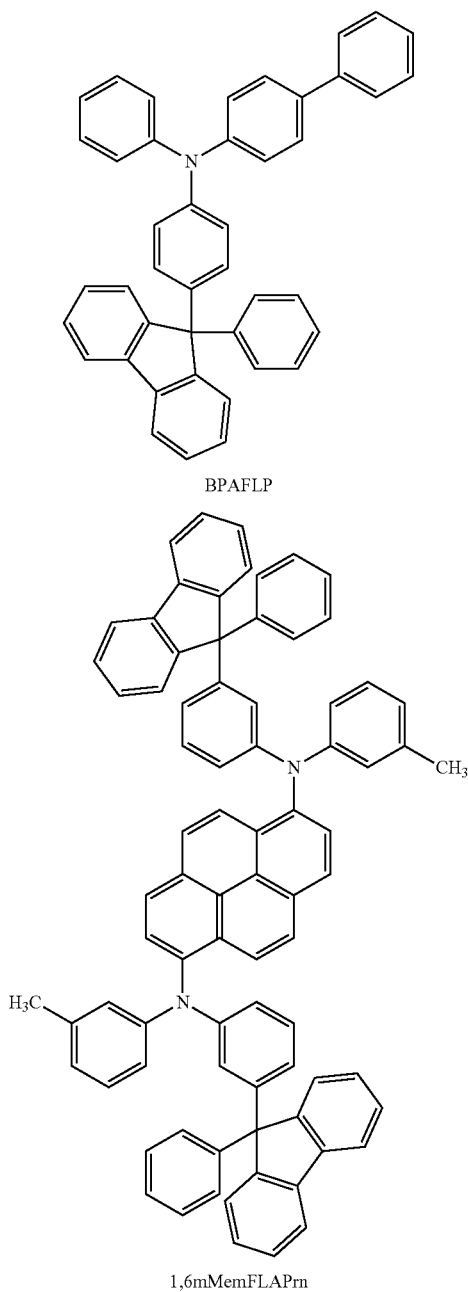

BPAFLP 1,6mMemFLAPrn

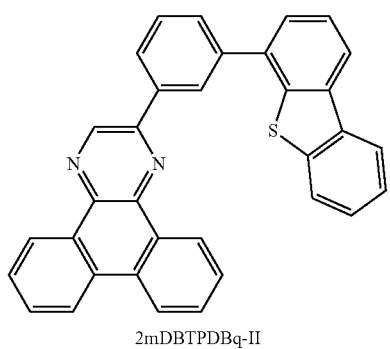

2mDBTPDBq-II

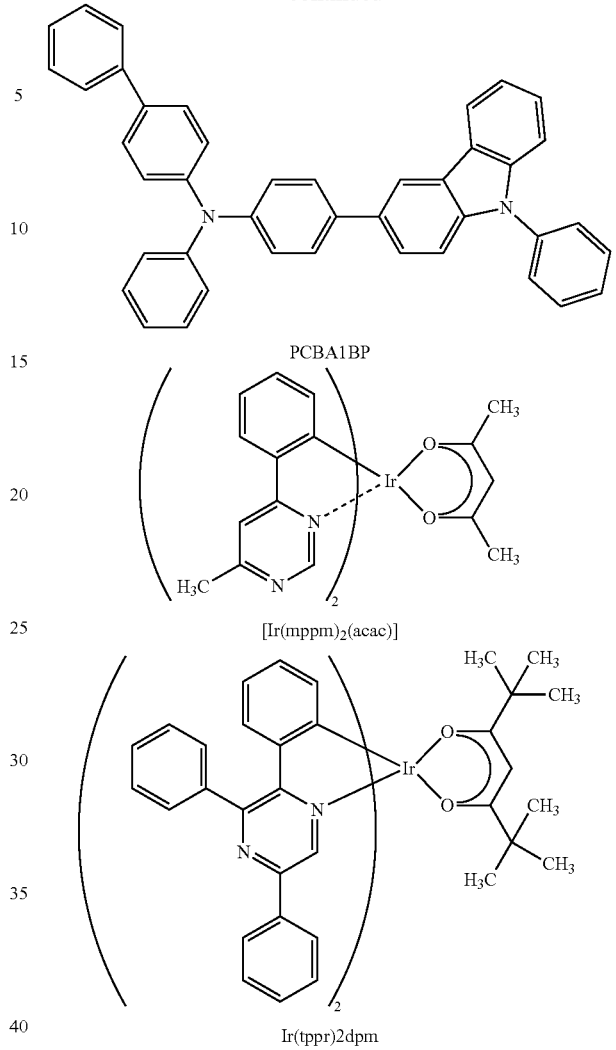

PCBA1BP

[Ir(mppm)₂(acac)]

Ir(tppr)2dpm (Manufacture of Light-Emitting Panel)

Next, a method for manufacturing a light-emitting panel 550 will be described.

First, the reflective film was formed over a glass substrate 1100 by a sputtering method. In this embodiment, a stacked film of an aluminum-titanium alloy film with a thickness of 200 nm and a titanium film with a thickness of 6 nm thereover was used as the reflective film.

Next, a film of indium tin oxide containing silicon oxide (abbreviation: ITSO) serving as the optical adjustment layer was formed to a thickness of 70 nm over the stacked film by a sputtering method.

Next, a resist mask was formed so as to overlap with regions serving as the first light-emitting element 510 and the second light-emitting element 520 later to protect the ITSO film, whereby the thickness of the ITSO film was kept 70 nm After that, the thickness of the ITSO film in regions serving as the third light-emitting element 530 and the fourth light-emitting element 540 was reduced to 30 nm by etching, and then a resist mask was formed so as to overlap with the region serving as the third light-emitting element 530 to protect the ITSO film in the region. After that, the ITSO film in the region serving as the fourth light-emitting element 540 was eliminated by etching.

Next, the reflective film and the ITSO film were etched using different resist masks to form one of a pair of electrodes in the first to fourth light-emitting elements.

A partition wall having an opening portion on a surface of the one of the pair of electrodes was formed in each of the light-emitting elements. The electrode area was 2 mm×2 mm.

Next, the glass substrate 1100 was fixed to a substrate holder provided in a vacuum evaporation apparatus such that the surface on which the reflective film was formed faced downward, and the pressure was reduced to approximately $10^{-4}$ Pa.

Next, the hole-injection layer 1511 was formed on the conductive film serving as the one of the pair of electrodes. As the hole-injection layer 1511, a layer containing a composite material of an organic compound and an inorganic compound was formed by co-evaporation of 9-phenyl-3-[4-(10-phenyl-9-anthryl)phenyl]-9H-carbazole (abbreviation: PCzPA) and molybdenum(VI) oxide. The thickness of the layer containing a composite material was 30 nm. The weight ratio of PCZPA to molybdenum oxide was adjusted to 2:1 (=PCZPA: molybdenum oxide). Note that the co-evaporation method refers to an evaporation method in which evaporation of a plurality of materials is performed using a plurality of evaporation sources at the same time in one treatment chamber.

Next, the hole-transport layer 1512 was formed on the hole-injection layer 1511. As the hole-transport layer 1512, PCzPA was deposited to a thickness of 20 nm by an evaporation method using resistance heating.

Next, the first light-emitting layer 1513 was formed on the hole-transport layer 1512. As the first light-emitting layer 1513, 9-[4-(10-phenyl-9-anthryl)phenyl]-9H-carbazole (abbreviation: CzPA) and N,N-bis(3-methylphenyl)-N,N'-bis [3-(9-phenyl-9H-fluoren-9-yl)phenyl]-pyrene-1,6-diamine (abbreviation: 1,6mMemFLPAPrn) were co-evaporated to a thickness of 30 nm. The evaporation rate was adjusted so that the weight ratio of CzPA to 1,6mMemFLPAPrn was 1:0.05 (=CzPA: 1,6mMemFLPAPrn).

Next, the electron-transport layer was formed on the first light-emitting layer 1513. The electron-transport layer includes the first electron-transport layer 1514a and the second electron-transport layer 1514b. Note that CzPA was deposited to a thickness of 5 nm as the first electron-transport layer 1514a, and bathophenanthroline (abbreviation: BPhen) was deposited thereover to a thickness of 15 nm as the second electron-transport layer 1514b.

Next, the electron-injection buffer 1504a was formed over the electron-transport layer 1514b. As the electron-injection buffer 1504a, calcium was deposited to a thickness of 1 nm.

Next, the electron-relay layer 1504b was formed over the electron-injection buffer 1504a. As the electron-relay layer 1504b, copper(II) phthalocyanine (abbreviation: CuPc) was deposited to a thickness of 2 nm.

Next, the charge-generation region 1504c was formed on the electron-relay layer 1504b. As the charge-generation region 1504c, a layer containing a composite material of an organic compound and an inorganic compound was formed by co-evaporation of PCzPA and molybdenum(VI) oxide. The thickness of the layer containing a composite material was 30 nm. The weight ratio of PCzPA to molybdenum oxide was adjusted to 2:1 (=PCzPA: molybdenum oxide).

Next, the hole-transport layer 1522 was formed on the charge-generation region 1504c. As the hole-transport layer 1522, 4-phenyl-4'-(9-phenylfluoren-9-yl)triphenylamine (abbreviation: BPAFLP) was deposited to a thickness of 20 nm by an evaporation method using resistance heating.

Next, the second light-emitting layer 1523a was formed on the hole-transport layer 1522. The second light-emitting layer 1523a was formed by co-evaporation of 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(6-methyl-4-phenylpyrimidinato) iridium(III) (abbreviation: Ir(mppm)$_2$(acac)) to a thickness of 20 nm. The evaporation rate was adjusted so that the weight ratio of 2mDBTPDBq-II to PCBA1BP and Ir(mppm)$_2$ (acac) was 0.8:0.2:0.06 (=2mDBTPDBq-II: PCBA1BP: Ir(mppm)$_2$(acac)).

Next, the third light-emitting layer 1523b was formed on the second light-emitting layer 1523a. The third light-emitting layer 1523b was formed by co-evaporation of 2mDBTPDBq-II and (dipivaloylmethanato)bis(2,3,5-triphenylpyrazinato)iridium(III) (abbreviation: Ir(tppr)$_2$(dpm)) to a thickness of 20 nm. The evaporation rate was adjusted so that the weight ratio of 2mDBTPDBq-II to Ir(tppr)$_2$(dpm) was 1:0.02 (=2mDBTPDBq-II: Ir(tppr)$_2$(dpm)).

Next, the electron-transport layer was formed on the third light-emitting layer 1523b. The electron-transport layer includes the third electron-transport layer 1524a and the fourth electron-transport layer 1524b. Note that 2mDBTPDBq-II was formed to a thickness of 15 nm as the third electron-transport layer 1524a and BPhen was formed thereover to a thickness of 15 nm as the fourth electron-transport layer 1524b.

Next, the electron-injection layer 1525 was formed over the fourth electron-transport layer 1524b. As the electron-injection layer 1525, lithium fluoride (LiF) was evaporated to a thickness of 1 nm.

Lastly, the semi-transmissive and semi-reflective film 512 serving as the other of the pair of electrodes was formed on the electron-injection layer 1525. As the semi-transmissive and semi-reflective film 512 serving as the other of the pair of electrodes, silver (Ag) and magnesium (Mg) were co-evaporated to a thickness of 10 nm by an evaporation method using resistance heating, and then indium tin oxide (abbreviation: ITO) was deposited to a thickness of 50 nm by a sputtering method. Through the above steps, the first light-emitting element 510 to the fourth light-emitting element 540 were manufactured. The evaporation rate was adjusted so that the volume ratio of Ag to Mg was 10:1 (=Ag:Mg).

The first light-emitting element 510 to the fourth light-emitting element 540 which were obtained through the above steps were sealed in a glove box in a nitrogen atmosphere so as not to be exposed to the air. Note that the layer 515 transmitting red light was provided in a position in the second light-emitting element, which overlaps with the semi-transmissive and semi-reflective film.

Next, measurement results of operation characteristics of the first light-emitting element 510, the second light-emitting element 520, the third light-emitting element 530, and the fourth light-emitting element 540 will be described. Note that the measurement was carried out at room temperature (in an atmosphere kept at 25° C.).

(Evaluation Results)

Figure 12:
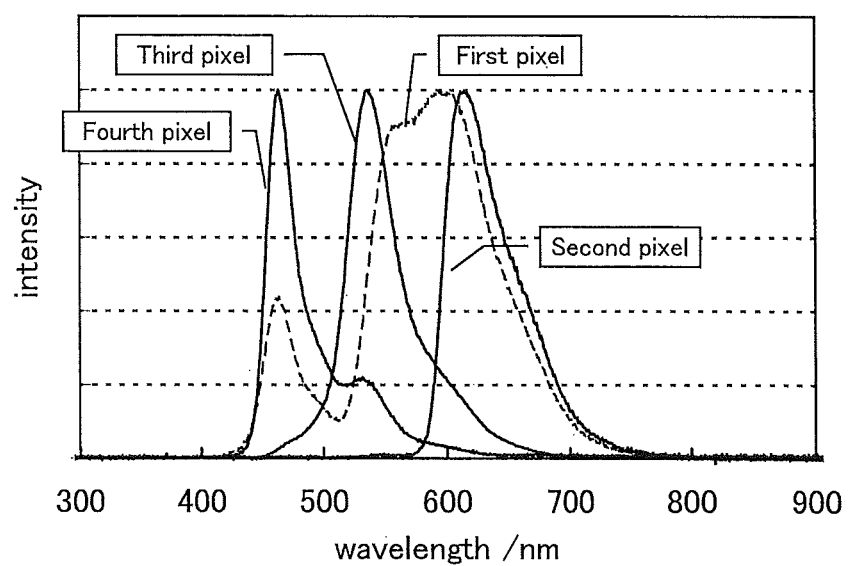
FIG. 12 shows emission spectra of light emitted from light-emitting elements according to Example.
Figure 13:
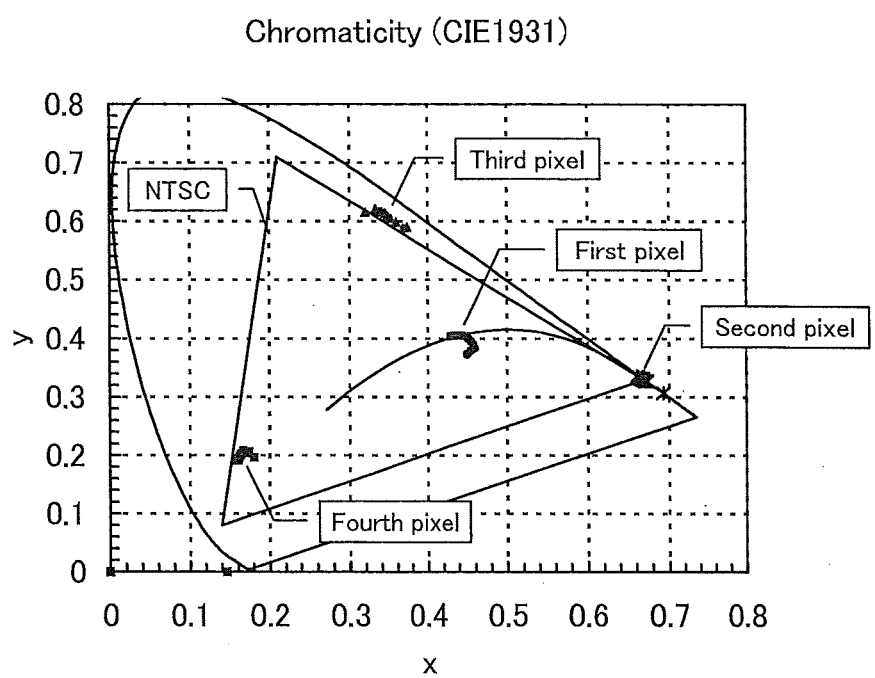
FIG. 13 shows chromaticity of light emitted from the light-emitting elements according to Example.
Figure 14:
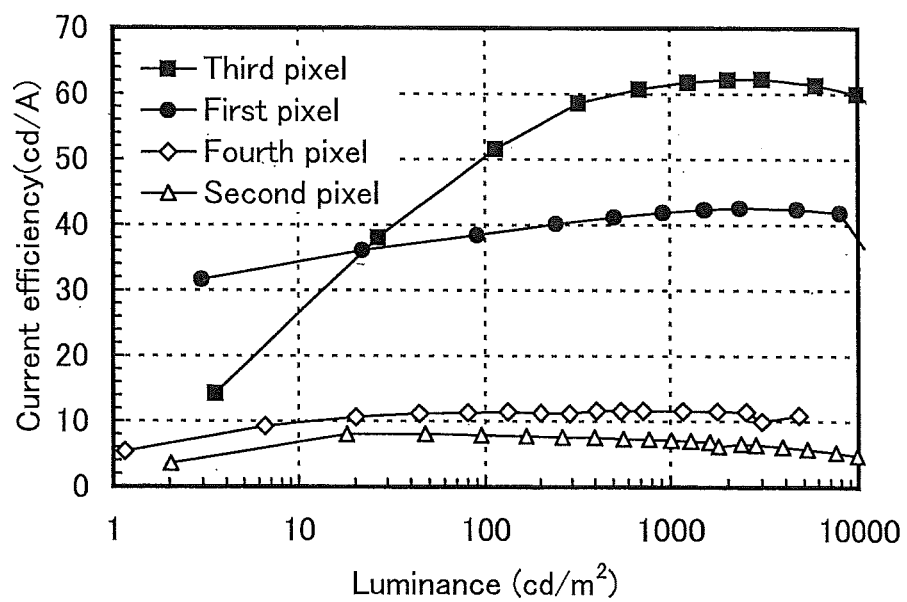
FIG. 14 shows luminance-current efficiency characteristics of the light-emitting elements according to Example.

FIG. 12, FIG. 13, and FIG. 14 respectively show emission spectra, chromaticity, and luminance-current efficiency characteristics of the first light-emitting element 510, the second light-emitting element 520, the third light-emitting element 530, and the fourth light-emitting element 540 in the case where current was applied to each of the light-emitting elements.

The CIE chromaticity coordinates of the first light-emitting element at a luminance of 919 cd/m² are (x=0.45, y=0.40), and pale while light was emitted. The current efficiency, the voltage, and the current density of the first light-emitting element at a luminance of 919 cd/m² are 41.9 cd/A, 6.0 V, and 2.2 mA/cm², respectively.

The CIE chromaticity coordinates of the second light-emitting element at a luminance of 1010 cd/m² are (x=0.67, y=0.33), and red light was emitted. The current efficiency, the voltage, and the current density of the second light-emitting element at a luminance of 1010 cd/m² are 7.1 cd/A, 7.0 V, and 14.2 mA/cm², respectively.

The CIE chromaticity coordinates of the third light-emitting element at a luminance of 1245 cd/m² are (x=0.34, y=0.61), and green light was emitted. The current efficiency, the voltage, and the current density of the third light-emitting element at a luminance of 1245 cd/m² are 61.8 cd/A, 6.0 V, and 2.0 mA/cm², respectively.

The CIE chromaticity coordinates of the fourth light-emitting element at a luminance of 1162 cd/m² are (x=0.16, y=0.20), and blue light was emitted. The current efficiency, the voltage, and the current density of the fourth light-emitting element at a luminance of 1162 cd/m² are 11.6 cd/A, 7.4 V, and 10.0 mA/cm², respectively.

The measurement results of the first to fourth light-emitting elements manufactured in this example show that the first light-emitting element emits mixed light including light with a wavelength greater than or equal to 600 nm and less than 800 nm and light with a wavelength greater than or equal to 400 nm and less than 600 nm, which are intensified between the pair of the reflective film and the semi-transmissive and semi-reflective film; the second light-emitting element emits red light obtained by extracting the mixed light through the layer transmitting red light; the third light-emitting element emits light with a wavelength greater than or equal to 500 nm and less than 600 nm, which is intensified between the pair of the reflective film and the semi-transmissive and semi-reflective film; and the fourth light-emitting element emits light with a wavelength greater than or equal to 400 nm and less than 500 nm, which is intensified between the pair of the reflective film and the semi-transmissive and semi-reflective film.

Thus, a light-emitting panel can be manufactured in which the first light-emitting element emits light having high brightness and a pale color and causing less eyestrain even in the case of long-time use, the second light-emitting element emits light of a bright red color, the third light-emitting element emits green light, and the fourth light-emitting element emits blue light. Further, a layer transmitting light of a specific color is not provided in all the light-emitting elements except the second light-emitting element; thus, light emitted from the layer containing a light-emitting organic compound can be efficiently used. As a result, a light-emitting panel which is capable of bright, full-color light emission and whose power consumption is reduced can be provided.

Reference Example

In this reference example, materials used in Example will be described.

Synthesis of 1,6mMemFLPAPrn

A synthesis example of N'-bis(3-methylphenyl)-N,N'-bis[3-(9-phenyl-9H-fluoren-9-yl)phenyl]-pyrene-1,6-diamine (abbreviation: 1,6mMemFLPAPrn)

Step 1: Method for synthesizing 3-methylphenyl-3-(9-phenyl-9H-fluoren-9-yl)phenylamine (abbreviation: mMemFLPA)

In a 200 mL three-neck flask were put 3.2 g (8.1 mmol) of 9-(3-bromophenyl)-9-phenylfluorene and 2.3 g (24.1 mmol) of sodium tert-butoxide. The air in the flask was replaced with nitrogen. To this mixture were added 40.0 mL of toluene, 0.9 mL (8.3 mmol) of m-toluidine, and 0.2 mL of a 10% hexane solution of tri(tert-butyl)phosphine. The temperature of this mixture was set to 60° C., and 44.5 mg (0.1 mmol) of bis(dibenzylideneacetone)palladium(0) was added to the mixture. The temperature of the mixture was raised to 80° C., followed by stirring for 2.0 hours. After the stirring, the mixture was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 1:1 ratio of hexane to toluene). Recrystallization from a mixed solvent of toluene and hexane was performed. Accordingly, 2.8 g of a white solid was obtained in 82% yield, which was the objective substance. The synthesis scheme of Step 1 is shown in (J–1) below.

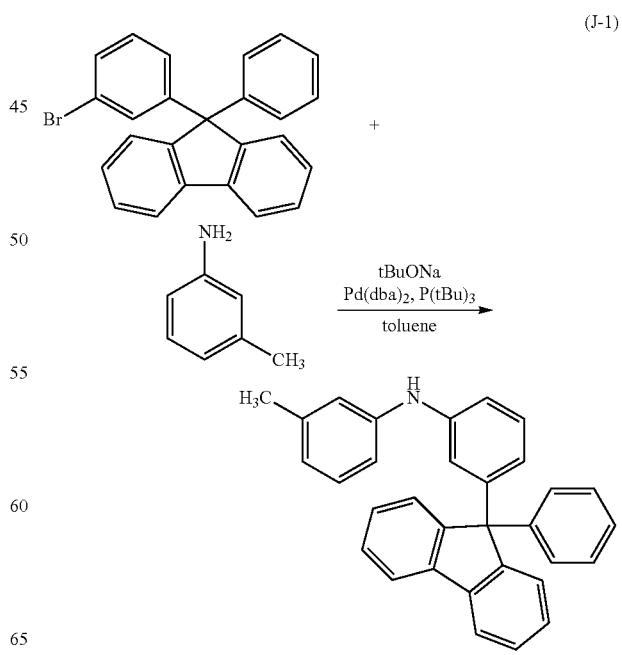

Step 2: Method for synthesizing N,N'-bis(3-methyl-phenyl)-N,N'-bis[3-(9-phenyl-9H-fluoren-9-yl)phenyl]pyrene-1,6-diamine (abbreviation: 1,6mMem-FLPAPrn)

In a 100 mL three-neck flask were put 0.6 g (1.7 mmol) of 1,6-dibromopyrene, 1.4 g (3.4 mmol) of 3-methylphenyl-3-(9-phenyl-9H-fluoren-9-yl)phenylamine, and 0.5 g (5.1 mmol) of sodium tert-butoxide. The air in the flask was replaced with nitrogen. To this mixture were added 21.0 mL of toluene and 0.2 mL of a 10% hexane solution of tri(tert-butyl)phosphine. The temperature of this mixture was set to 60° C., and 34.9 mg (0.1 mmol) of bis(dibenzylideneacetone)palladium(0) was added to the mixture, followed by stirring for 3.0 hours. After the stirring, 400 mL of toluene was added to the mixture, and the mixture was heated. While the mixture was kept hot, it was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 3:2 ratio of hexane to toluene) to give a yellow solid. Recrystallization of the obtained yellow solid from a mixed solvent of toluene and hexane gave 1.2 g of a yellow solid in 67% yield, which was the objective substance.

By a train sublimation method, 1.0 g of the obtained yellow solid was purified. In the purification, the yellow solid was heated at 317° C. under a pressure of 2.2 Pa with a flow rate of argon gas of 5.0 mL/min After the purification, 1.0 g of a yellow solid was obtained in a yield of 93%, which was the objective substance. The synthesis scheme of Step 2 is shown in (J-2) below.

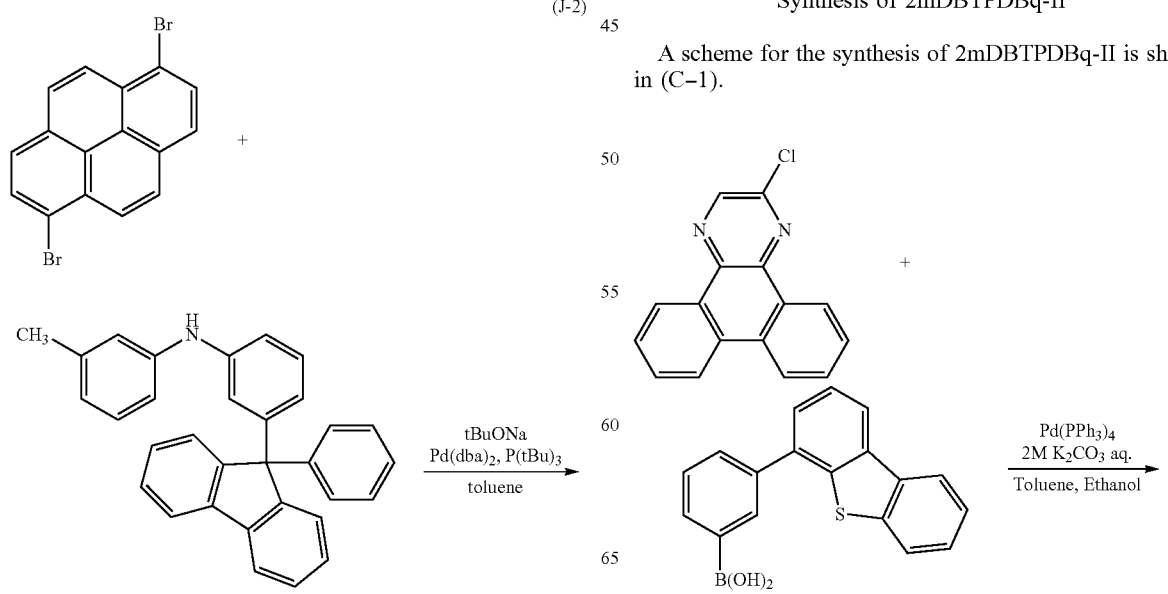

(J-2)

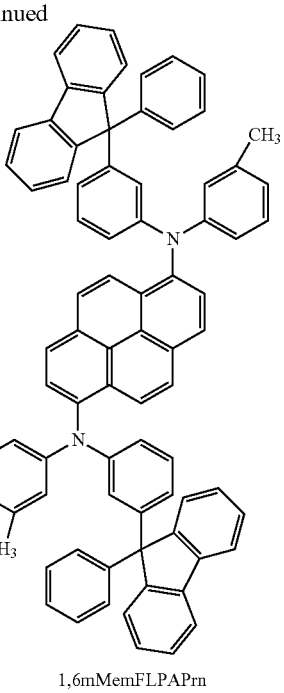

1,6mMemFLPAPrn

A nuclear magnetic resonance (NMR) method identified this compound as N,N'-bis(3-methylphenyl)-N,N'-bis[3-(9-phenyl-9H-fluoren-9-yl)phenyl]-pyrene-1,6-diamine (abbreviation: 1,6mMemFLPAPrn), which was the objective substance.

$^1$H NMR data of the obtained compound are as follows: $^1$H NMR (CDCl$_3$, 300 MHz): δ=2.21 (s, 6H), 6.67 (d, J=7.2 Hz, 2H), 6.74 (d, J=7.2 Hz, 2H), 7.17-7.23 (in, 34H), 7.62 (d, J=7.8 Hz, 4H), 7.74 (d, J=7.8 Hz, 2H), 7.86 (d, J=9.0 Hz, 2H), 8.04 (d, J=8.7 Hz, 4H)

Synthesis Example of 2mDBTPDBq-II

A method for synthesizing 2-[3-(dibenzothiophen-4-yl)phenyl]dibenzo[f,h]quinoxaline (abbreviation: 2mDBTPDBq-II) will be described.

Synthesis of 2mDBTPDBq-II

A scheme for the synthesis of 2mDBTPDBq-II is shown in (C-1).

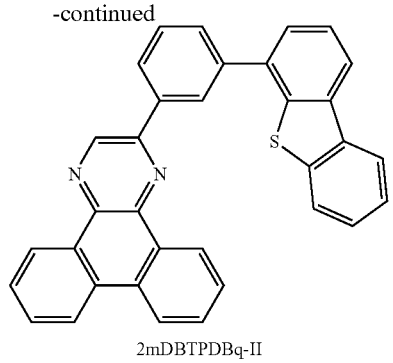

2mDBTPDBq-II

In a 2 L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous potassium carbonate solution. The mixture was degassed by being stirred under reduced pressure, and the atmosphere in the flask was replaced with nitrogen. This mixture was stirred under a nitrogen stream at 100° C. for 7.5 hours. After cooling to room temperature, the obtained mixture was filtered to give a white substance. The substance obtained by the filtration was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135), to give a clear colorless filtrate. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of a white powder in a yield of 80%, which was the objective substance.

The above objective substance was relatively soluble in hot toluene, but was a material that was easy to precipitate when cooled. Further, the substance was poorly soluble in other organic solvents such as acetone and ethanol. Hence, the utilization of these different degrees of solubility resulted in a high-yield synthesis by a simple method as above. Specifically, after the reaction finished, the mixture was returned to room temperature and the precipitated solid was collected by filtration, so that most impurities were able to be easily removed. Further, by the column chromatography using hot toluene as a developing solvent, the generated substance, which was easily precipitated, was able to be readily purified.

By a train sublimation method, 4.0 g of the obtained white powder was purified. In the purification, the white powder was heated at 300° C. under a pressure of 5.0 Pa with a flow rate of argon gas of 5 mL/min. After the purification, 3.5 g of a white powder was obtained in a yield of 88%, which was the objective substance.

A nuclear magnetic resonance (NMR) method identified this compound as 2-[3-(dibenzothiophen-4-yl)phenyl]dibenzo[f,h]quinoxaline (abbreviation: 2mDBTPDBq-II), which was the objective substance.

$^1$H NMR data of the obtained substance are as follows: $^1$H NMR (CDCl$_3$, 300 MHz): δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

Synthesis Example of [Ir(mppm)$_2$(acac)]

A synthesis example of (acetylacetonato)bis(6-methyl-4-phenylpyrimidinato)iridium(III) (abbreviation: [Ir(mppm)$_2$(acac)]) will be described.

Step 1: Synthesis of 4-methyl-6-phenylpyrimidine (abbreviation: Hmppm)

First, in a recovery flask equipped with a reflux pipe were put 4.90 g of 4-chloro-6-methylpyrimidine, 4.80 g of phenylboronic acid, 4.03 g of sodium carbonate, 0.16 g of bis(triphenylphosphine)palladium(II) dichloride (abbreviation: Pd(PPh$_3$)$_2$Cl$_2$), 20 mL of water, and 10 mL of acetonitrile, and the air in the flask was replaced with argon. This reaction container was heated by irradiation with microwaves (2.45 GHz, 100 W) for 60 minutes. Here, in the flask were further put 2.28 g of phenylboronic acid, 2.02 g of sodium carbonate, 0.082 g of Pd(PPh$_3$)$_2$Cl$_2$, 5 mL of water, and 10 mL of acetonitrile, and the mixture was heated again by irradiation with microwaves (2.45 GHz, 100 W) for 60 minutes. After that, water was added to this solution and extraction with dichloromethane was carried out. The obtained solution of the extract was washed with a saturated sodium carbonate aqueous solution, water, and saturated saline in this order, and dried with magnesium sulfate. After the drying, the solution was filtered. The solvent of this solution was distilled off, and then the obtained residue was purified by silica gel column chromatography using dichloromethane and ethyl acetate as a developing solvent in a volume ratio of 9:1, so that a pyrimidine derivative Hmppm, which was the objective substance, was obtained (orange oily substance, yield of 46%). Note that the irradiation with microwaves was performed using a microwave synthesis system (Discover, manufactured by CEM Corporation). The synthesis scheme of Step 1 is shown in (b-1) below.

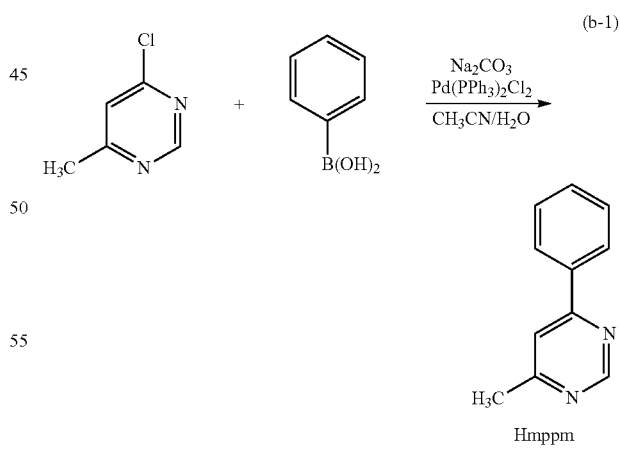

Step 2: Synthesis of di-m-chloro-bis[bis(6-methyl-4-phenylpyrimidinato)iridium(III)] (abbreviation: [Ir(mppm)$_2$Cl]$_2$)

Next, in a recovery flask equipped with a reflux pipe were put 15 mL of 2-ethoxyethanol, 5 mL of water, 1.51 g of Hmppm obtained in Step 1 above, and 1.26 g of iridium chloride hydrate (IrCl$_3$·H$_2$O), and the air in the flask was replaced with argon. After that, irradiation with microwaves (2.45 GHz, 100 W) was performed for 1 hour to cause a reaction. The solvent was distilled off, and then the obtained residue was washed with ethanol and filtered to give a dinuclear complex [Ir(mppm)$_2$Cl]$_2$ (dark green powder, yield of 77%). The synthesis scheme of Step 2 is shown in (b-2) below.

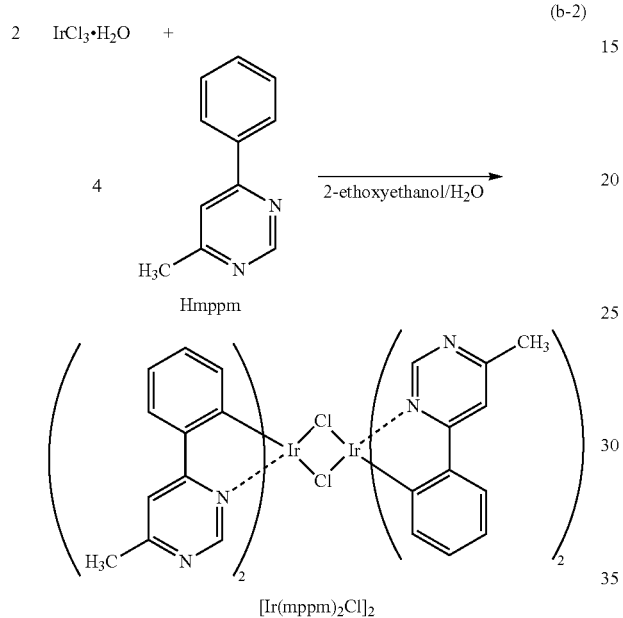

Step 3: Synthesis of (acetylacetonato)bis(6-methyl-4-phenylpyrimidinato)iridium(III) (abbreviation: [Ir(mppm)$_2$(acac)])

Furthermore, in a recovery flask equipped with a reflux pipe were put 40 mL of 2-ethoxyethanol, 1.84 g of the dinuclear complex [Ir(mppm)$_2$Cl]$_2$ obtained in Step 2, 0.48 g of acetylacetone, and 1.73 g of sodium carbonate, and the air in the recovery flask was replaced with argon. After that, irradiation with microwaves (2.45 GHz, 100 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. After the drying, the solution was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane, so that a yellow powder, which was the objective substance, was obtained (yield of 44%). The synthesis scheme of Step 3 is shown in (b-3) below.

An analysis result by nuclear magnetic resonance spectrometry ($^1$H NMR) of the yellow powder obtained in Step 3 is described below. The result shows that this compound was (acetylacetonato)bis(6-methyl-4-phenylpyrimidinato)iridium(III) (abbreviation: [Ir(mppm)$_2$(acac)], which was the objective substance.

$^1$H NMR. δ (CDCl$_3$): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

This application is based on Japanese Patent Application serial no. 2011-068680 filed with Japan Patent Office on Mar. 25, 2011, the entire contents of which are hereby incorporated by reference.

What is claimed is:
1. A light-emitting panel comprising:
a first light-emitting element:
a second light-emitting element; and
a third light-emitting element,
wherein each of the first light-emitting element, the second light-emitting element, and the third light-emitting element comprises a reflective film, an optical adjustment layer, a layer containing a light-emitting organic compound, and a semi-transmissive and semi-reflective film,
wherein, in each of the first light-emitting element, the second light-emitting element, and the third light-emitting element, the optical adjustment layer and the layer containing the light-emitting organic compound are interposed between the reflective film and the semi-transmissive and semi-reflective film,
wherein the layer in each of the first light-emitting element, the second light-emitting element, and the third light-emitting element emits light comprising light with a wavelength greater than or equal to 600 nm and less than 800 nm and light with a wavelength greater than or equal to 400 nm and less than 600 nm, wherein an optical path length between the reflective film and the semi-transmissive and semi-reflective film in the first light-emitting element is N/2 (N is a natural number) of a length greater than or equal to 600 nm and less than 800 nm, wherein an optical path length between the reflective film and the semi-transmissive and semi-reflective film in the second light-emitting element is N/2 (N is a natural number) of a length greater than or equal to 600 nm and less than 800 nm, wherein a color filter is provided over the second light-emitting element, and wherein an optical path length between the reflective film and the semi-transmissive and semi-reflective film in the third light-emitting element is N/2 (N is a natural number) of a length greater than or equal to 400 nm and less than 600 nm.

2. The light-emitting panel according to claim 1, wherein the optical path length between the reflective film and the semi-transmissive and semi-reflective film in the first light-emitting element is equal to the optical path length between the reflective film and the semi-transmissive and semi-reflective film in the second light-emitting element.

3. The light-emitting panel according to claim 1, wherein the color filter is capable of transmitting red light.

4. The light-emitting panel according to claim 1, wherein the optical adjustment layer in each of the first light-emitting element, the second light-emitting element, and the third light-emitting element has electrical conductivity.

5. The light-emitting panel according to claim 1, wherein the semi-transmissive and semi-reflective film in each of the first light-emitting element, the second light-emitting element, and the third light-emitting element has electrical conductivity.

6. The light-emitting panel according to claim 1, wherein the reflective film in each of the first light-emitting element, the second light-emitting element, and the third light-emitting element has electrical conductivity.

7. The light-emitting panel according to claim 1, wherein the layer containing the light-emitting organic compound in each of the first light-emitting element, the second light-emitting element, and the third light-emitting element are formed of one continuous film.

8. A light-emitting device comprising the light-emitting panel according to claim 1.

9. A lighting device comprising the light-emitting panel according to claim 1.

10. A light-emitting panel comprising:
a first light-emitting element:
a second light-emitting element;
a third light-emitting element; and
a fourth light-emitting element,
wherein each of the first light-emitting element, the second light-emitting element, the third light-emitting element, and the fourth light-emitting element comprises a reflective film, an optical adjustment layer, a layer containing a light-emitting organic compound, and a semi-transmissive and semi-reflective film,
wherein, in each of the first light-emitting element, the second light-emitting element, the third light-emitting element, and the fourth light-emitting element, the optical adjustment layer and the layer containing the light-emitting organic compound are interposed between the reflective film and the semi-transmissive and semi-reflective film, wherein the layer in each of the first light-emitting element, the second light-emitting element, the third light-emitting element, and the fourth light-emitting element emits light comprising light with a wavelength greater than or equal to 600 nm and less than 800 nm, light with a wavelength greater than or equal to 500 nm and less than 600 nm, and light with a wavelength greater than or equal to 400 nm and less than 500 nm, wherein an optical path length between the reflective film and the semi-transmissive and semi-reflective film in the first light-emitting element is N/2 (N is a natural number) of a length greater than or equal to 600 nm and less than 800 nm, wherein an optical path length between the reflective film and the semi-transmissive and semi-reflective film in the second light-emitting element is N/2 (N is a natural number) of a length greater than or equal to 600 nm and less than 800 nm, wherein a color filter is provided over the second light-emitting element, wherein an optical path length between the reflective film and the semi-transmissive and semi-reflective film in the third light-emitting element is N/2 (N is a natural number) of a length greater than or equal to 500 nm and less than 600 nm, and wherein an optical path length between the reflective film and the semi-transmissive and semi-reflective film in the fourth light-emitting element is N/2 (N is a natural number) of a length greater than or equal to 400 nm and less than 500 nm.

11. The light-emitting panel according to claim 10, wherein the optical path length between the reflective film and the semi-transmissive and semi-reflective film in the first light-emitting element is equal to the optical path length between the reflective film and the semi-transmissive and semi-reflective film in the second light-emitting element.

12. The light-emitting panel according to claim 10, wherein the color filter is capable of transmitting red light.

13. The light-emitting panel according to claim 10, wherein the optical adjustment layer in each of the first light-emitting element, the second light-emitting element, the third light-emitting element, and the fourth light-emitting element has electrical conductivity.

14. The light-emitting panel according to claim 10, wherein the semi-transmissive and semi-reflective film in each of the first light-emitting element, the second light-emitting element, the third light-emitting element, and the fourth light-emitting element has electrical conductivity.

15. The light-emitting panel according to claim 10, wherein the reflective film in each of the first light-emitting element, the second light-emitting element, the third light-emitting element, and the fourth light-emitting element has electrical conductivity.

16. The light-emitting panel according to claim 10, wherein the layer in each of the first light-emitting element, the second light-emitting element, the third light-emitting element, and the fourth light-emitting element are formed of one continuous film.

17. A light-emitting device comprising the light-emitting panel according to claim 10.

18. A lighting device comprising the light-emitting panel according to claim 10.

* * * * *